US006836142B2

(12) United States Patent
Lesea et al.

(10) Patent No.: US 6,836,142 B2
(45) Date of Patent: Dec. 28, 2004

(54) ASYMMETRIC BIDIRECTIONAL BUS IMPLEMENTED USING AN I/O DEVICE WITH A DIGITALLY CONTROLLED IMPEDANCE

(75) Inventors: Austin H. Lesea, Los Gatos, CA (US); Atul V. Ghia, San Jose, CA (US)

(73) Assignee: Xilinx, Inc., San Jose, CA (US)

(*) Notice: Subject to any disclaimer, the term of this patent is extended or adjusted under 35 U.S.C. 154(b) by 0 days.

(21) Appl. No.: 10/194,679

(22) Filed: Jul. 12, 2002

(65) Prior Publication Data

US 2004/0008054 A1 Jan. 15, 2004

(51) Int. Cl.[7] .............................................. H03K 17/16

(52) U.S. Cl. ............................ 326/30; 326/86; 326/83; 326/90; 327/541; 327/281

(58) Field of Search ............................ 326/30, 83, 86, 326/90; 327/108, 541, 543, 566

(56) References Cited

U.S. PATENT DOCUMENTS 5,134,311 A 7/1992 Biber et al.
5,463,326 A 10/1995 Raje
5,506,541 A 4/1996 Herndon
5,559,441 A 9/1996 Desroches
5,877,632 A 3/1999 Goetting et al.
5,949,268 A 9/1999 Miura et al.
6,046,653 A * 4/2000 Yamada ........................ 333/32
6,087,847 A 7/2000 Mooney et al.
6,094,069 A 7/2000 Magane et al.
6,154,047 A * 11/2000 Taguchi ........................ 326/30
6,160,417 A * 12/2000 Taguchi ........................ 326/30
6,232,814 B1 5/2001 Douglas, III
6,265,893 B1 * 7/2001 Bates ........................... 326/30
6,356,106 B1 * 3/2002 Greeff et al. .................. 326/30
6,445,245 B1 * 9/2002 Schultz et al. .............. 327/541
6,489,837 B2 * 12/2002 Schultz et al. .............. 327/541

FOREIGN PATENT DOCUMENTS

EP 0 978 943 A2 2/2000

OTHER PUBLICATIONS

Thaddeus J. Gabara; "Digitally Adjustable Resistors in CMOS for High–Performance Applications"; 1992 IEEE Journal of Solid–State Circuits, Aug. 1992, No. 8; New York; pp. 1176–1185.

Aris Balastsos et al., "TA 10.4 Low–Skew Clock Generator with Dynamic Impedance and Delay Matching"; 1999 IEEE International Solid–State Circuits Conference; 0–7803–5129–0/99.

Toshiro Takahashi et al.; "TA 10.1 110GB/s Simultaneous Bi–Directional Transceiver Logic Synchronized with a System Clock"; 1999 IEEE International Solid–State Circuits Conference; 0–7803–5129–0/99.

Sai Vishwanthaiah et al.; "TP 15.1 Dynamic Termination Output Driver for a 600MHz Microprocessor"; 2000 IEEE International Solid–State Circuits Conference; 0–7803–5853–8/00.

* cited by examiner

*Primary Examiner*—Vibol Tan
(74) *Attorney, Agent, or Firm*—E. Eric Hoffman; Bernard Hoffman

(57) ABSTRACT

A system and method are provided for replacing dedicated external termination resistors typically used to implement an asymmetrical unidirectional bus I/O standard with programmable resistances that are dynamically selected by programming output driver circuits having digitally controlled impedances.

10 Claims, 16 Drawing Sheets

ASYMMETRIC BIDIRECTIONAL BUS IMPLEMENTED USING AN I/O DEVICE WITH A DIGITALLY CONTROLLED IMPEDANCE

FIELD OF THE INVENTION

The present invention relates to the use of an input/output (I/O) circuit having a digitally controlled impedance to implement an asymmetric bus I/O protocol.

RELATED ART

Modern bus applications are commonly introduced with bus I/O standards tailored specifically to the needs of that application. The bus I/O standards provide specifications to vendors who create products designed to interface with these applications. Each bus I/O standard often has its own specifications for current, voltage, I/O buffering and termination techniques. It would be desirable for programmable logic devices to be compatible with as many bus I/O standards as possible, such that these programmable logic devices are capable of interfacing with as many applications as possible.

FIG. 1 is a block diagram of a conventional high speed digital system 100, which operates in accordance with a conventional bus I/O standard known as terminated high-speed transistor logic (HSTL) Class I. The HSTL Class I standard provides for a single-ended (asymmetric) termination and unidirectional signal transfer. System 100 includes a first device 101 having an output driver circuit 111 (which is supplied by a $V_{CCO}$ voltage equal to 1.5 Volts) and a second device 102 having an input buffer 112 (which operates in response to a reference voltage $V_{REF}$ equal to 0.75 Volts and signals generated by first device 101). The first and second devices 101 and 102 are mounted on a printed circuit board 103. An electrically conductive trace 104 located on printed circuit board 103 couples output driver 111 of first device 101 to input buffer 112 of second device 102. In accordance with the HSTL Class I standard, trace 104 has an impedance of 50 ohms. An external dedicated resistor 105 is located on printed circuit board 104, and connected to the end of trace 104 located adjacent to second device 102. In accordance with the HSTL Class I standard, resistor 105 is selected to have a matching resistance of 50 ohms, and is biased with a voltage VTT of 0.75 Volts (i.e., $V_{CCO}/2$).

Signals are transmitted in a unidirectional manner from output driver 111 to input buffer 112 via trace 104. Termination resistor 105 absorbs or prevents signal reflections, which may otherwise interfere with the function of system 100. Bi-directional communication on trace 104 is prevented or compromised (by slower performance and non-optimal signal integrity) by the presence of immovable fixed resistor 105. Similarly, bi-directional communication between multiple devices coupled to trace 104 is impossible or impractical in the presence of fixed termination resistor 105.

Because resistor 105 is fixed on printed circuit board 103, this resistor 105 cannot be easily removed from system 100. System 100 is therefore constrained by the presence of resistor 105, and cannot be easily re-arranged to implement another bus I/O standard (unless that standard requires termination resistor 105).

It would therefore be desirable to have a programmable logic device that is able to overcome the above-described deficiencies of high-speed digital system 100.

SUMMARY

Accordingly, the present invention provides a system that replaces one or more dedicated external termination resistors in an asymmetrical bus I/O standard with programmable impedances provided by controlling output driver circuits on integrated circuit chips.

An output driver circuit is used to implement a termination resistor as follows. An I/O circuit according to the present invention includes a pad, an input buffer circuit and an output driver circuit. A first I/O circuit on a first integrated circuit device may be coupled to a second I/O circuit on a second integrated circuit device by a bus line coupled to the pads of the first and second I/O circuits. Instead of being terminated by external dedicated resistors, the bus line is terminated by programmable impedances introduced by the output driver circuits in the first and second I/O circuits.

For example, assume that a signal is being driven from the output driver circuit of the first I/O circuit to the input buffer of the second I/O circuit. In this case, the output driver circuit (or a portion thereof) in the second I/O circuit is used to implement a termination resistor equivalent to termination resistor 105 (FIG. 1). More specifically, the output driver in the second I/O circuit is tri-stated, such that this output driver is not responsive to signals applied to its input terminal. This output driver circuit includes a plurality of p-channel transistors coupled between the pad and a $V_{CC}$ voltage supply terminal, and a plurality of n-channel transistors coupled between the pad and a ground voltage supply terminal. A digitally controlled impedance (DCI) control circuit is used to turn on a particular set of the p-channel transistors and/or the n-channel transistors, thereby providing the desired termination impedance at the second end of the bus line.

Advantageously, signals can also be driven from the output driver circuit of the second I/O circuit to the input buffer of the first I/O circuit. That is, the direction of signal transfer can be reversed. To provide the proper termination, the output driver circuit in the first I/O circuit is used to implement a termination resistor equivalent to termination resistor 105 (FIG. 1). More specifically, the output driver in the first I/O circuit is tri-stated, and a corresponding DCI control circuit is used to turn on a particular set of the p-channel transistors and/or the n-channel transistors in the output driver, thereby providing the desired termination impedance at the first end of the bus line. Note that the termination resistance previously provided by the output driver circuit of the second I/O circuit is disabled or modified at this time, depending on the particular bus I/O standard being used.

The output driver circuit that is driving the bus line can also be used to provide a desired termination resistance on the driving end of the bus line. This termination resistance can be modeled as a series and/or parallel resistance.

The manner in which the DCI control circuits are used to control the impedances of the output driver circuits is described in commonly-owned U.S. patent application Ser. No. 09/684,539, entitled "Digitally Controlled Impedance for I/O of an Integrated Circuit Driver" filed by David P. Schultz et al, on Oct. 6, 2000. Portions of this case are replicated below to assist in the understanding of the present invention.

The present invention will be more fully understood in view of the following description and drawings.

DETAILED DESCRIPTION

In general, the present invention allows termination resistances to be implemented by appropriately controlling I/O driver circuits having a digitally controlled impedance (DCI) feature. More specifically, the present invention allows single-ended or asymmetrical termination resistances to be implemented using I/O driver circuits having a DCI feature. In one embodiment, the DCI driver circuits are dynamically modified to enable bi-directional signal transfer using a single-ended or asymmetrical termination standard.

For example, in a system implementing an HSTL Class I standard, a first DCI I/O driver circuit can be controlled to provide the required termination resistance when the first DCI I/O driver circuit is receiving a signal from a second DCI I/O driver circuit. Conversely, the second DCI I/O driver circuit, can be controlled to provide the required termination resistance when the second DCI I/O driver circuit is receiving a signal from the first DCI I/O driver circuit. The first DCI I/O driver circuit is controlled to remove the previously provided termination resistance at this time.

By providing the desired termination resistances using DCI drivers, conventional fixed external resistors can advantageously be eliminated.

An I/O driver circuit having a DCI feature has been described in commonly-owned U.S. patent application Ser. No. 09/684,539, entitled "Digitally Controlled Impedance for I/O of an Integrated Circuit Driver" filed by David P. Schultz et al, on Oct. 6, 2000. This DCI I/O driver circuit, which is used to implement the present invention, is described in detail below.

Figure 2:
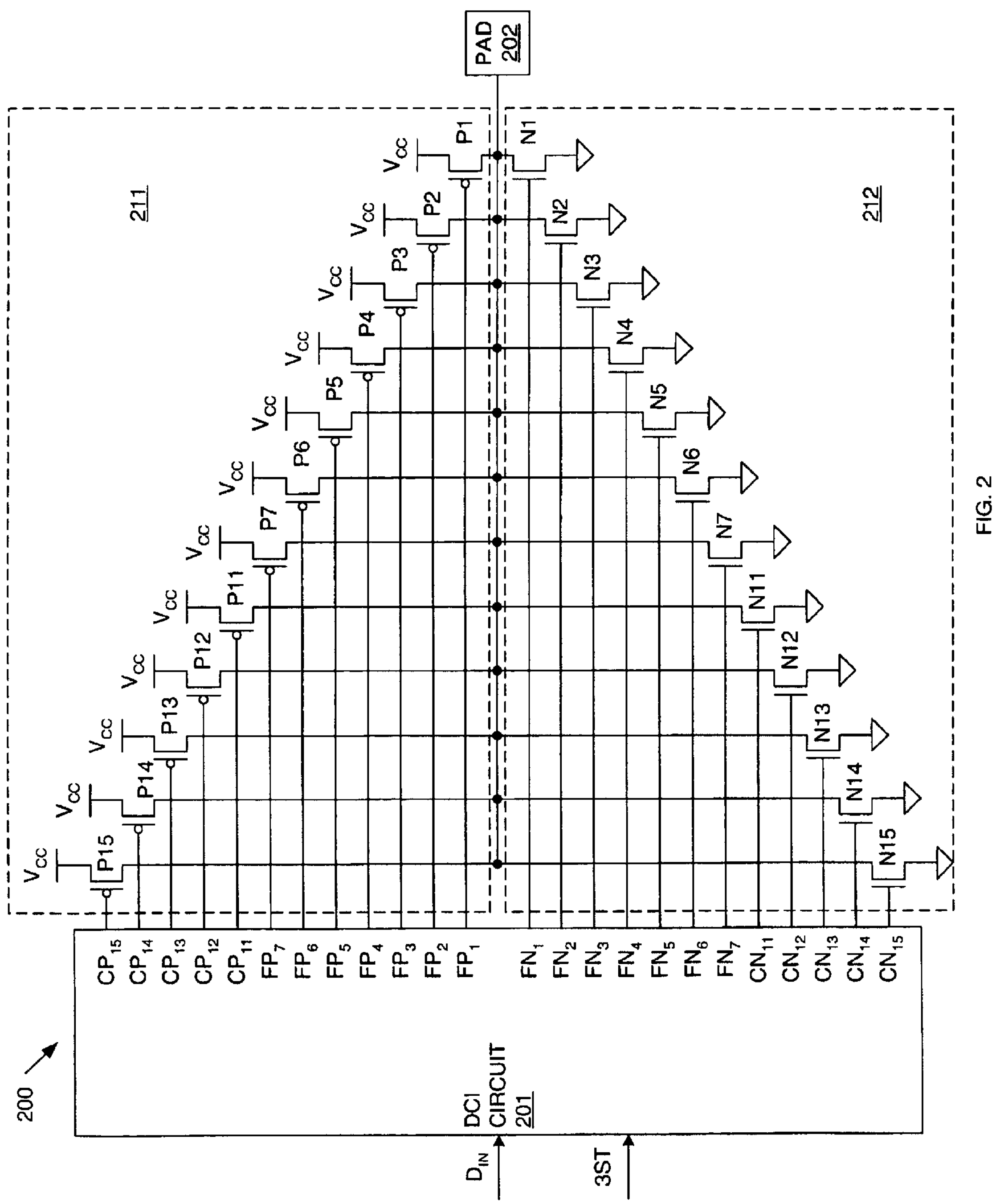
FIG. 2 is a circuit diagram of an output driver circuit.

FIG. 2 is a circuit diagram of an output driver 200, which is used in accordance with one embodiment of the present invention. Output driver 200 includes digitally controlled impedance (DCI) circuit 201, p-channel pull-up transistors P1–P7 and P11–P15, n-channel pull-down transistors N1–N7 and N11–N15, and I/O pad 202. P-channel pull-up transistors P1–P7 and P11–P15 are collectively referred to as p-channel transistors 211, and n-channel pull-down transistors N1–N7 and N11–N15 are collectively referred to as n-channel transistors 212. In other embodiments, other combinations of transistors can be used.

As described in more detail below, p-channel transistors P1–P7 are used as "fine-adjustment" transistors, each having an on-conductance of "$Y_P$" siemens. Similarly, n-channel transistors N1–N7 are used as "fine-adjustment" transistors, each having an on-conductance of "$Y_N$" siemens. P-channel transistors P11–P15 are used as "coarse-adjustment" transistors, having on-conductances of $1X_P$, $2X_P$, $4X_P$, $8X_P$ and $16X_P$ siemens, respectively. N-channel transistors N11–N15 are also used as "coarse-adjustment" transistors, having on-conductances of $1X_N$, $2X_N$, $4X_N$, $8X_N$ and $16X_N$ siemens, respectively. In the described example, $Y_P$ is approximately equal to $X_P$, and $X_N$ is approximately equal to $X_N/2$. In other embodiments, other conductance values can be used.

Each of fine p-channel transistors P1–P7 and coarse p-channel transistors P11–P15 has a source coupled to a $V_{CC}$ voltage supply terminal. Each of fine n-channel transistors N1–N7 and coarse n-channel transistors N11–N15 has a source coupled to a ground voltage supply terminal. The drains of transistors P1–P7, P11–P15, N1–N7 and N11–N15 are coupled to I/O pad 202.

The gates of fine p-channel transistors P1–P7 are coupled to receive control signals $FP_1$–$FP_7$, respectively, from DCI circuit 201. Similarly, the gates of coarse p-channel transistors P11–P15 are coupled to receive control signals $CP_{11}$–$CP_{15}$, respectively, from DCI circuit 201.

The gates of fine n-channel transistors N1–N7 are coupled to receive control signals $FN_1$–$FN_7$, respectively, from DCI circuit 201. Similarly, the gates of coarse n-channel transistors N11–N15 are coupled to receive control signals $CN_{11}$–$CN_{15}$, respectively, from DCI circuit 201.

DCI circuit 201 is configured to receive a data input signal DIN and a tri-state signal 3ST, each having a logic high or logic low value. In general, if 3ST signal has a logic low value (i.e., driver 200 is not tri-stated) and the DIN signal has a logic low value, DCI circuit 201 asserts one or more of the control signals $FP_1$–$FP_7$, $CP_1$–$CP_{15}$ to a logic low value, thereby turning on one or more of p-channel transistors P1–P7, P11–P15. The turned on p-channel transistors are selected in a manner described in more detail below. DCI circuit 201 also provides logic low control signals $FN_1$–$FN_7$, $CN_{11}$–$CN_{15}$, thereby turning off all of n-channel transistors N1–N7 and N11–N15. As a result, pad 202 is coupled to the $V_{CC}$ voltage supply terminal through the turned-on p-channel transistors. DCI circuit 201 selects the turned-on p-channel transistors to provide a particular resistance between the $V_{CC}$ voltage supply terminal and pad 202.

If the 3ST signal has a logic high value, then output driver circuit 200 is tri-stated and will generally not drive pad 202. However, if output driver circuit 200 is used to provide a transmission line termination (as described in more detail below), then output driver circuit 200 will be configured to turn on a combination of n-channel and/or p-channel transistors to provide the appropriate transmission line termination resistance.

In the examples described below, coarse p-channel transistors P1–P15 are enabled in a binary count order to provide a coarse resistance adjustment. Fine p-channel transistors P1–P7 are then enabled or disabled to provide a fine resistance adjustment. For example, fine p-channel transistors P1–P3 and, coarse p-channel transistor P13 may be turned on when the DIN signal has a low value. In this example, the equivalent conductance of the p-channel portion of output driver circuit 200 would be equal to $X_p+X_p+X_p+4x_p$, or $7X_p$ siemens.

If 3ST signal has a logic low value and the DIN signal has a logic high value, then DCI circuit 201 asserts one or more of the control signals $FN_1$–$FN_7$, $CN_{11}$–$CN_{15}$ to a logic high value, thereby turning on one or more of n-channel transistors N1–N7, N11–N15. The turned on n-channel transistors are selected in a manner described in more detail below. DCI circuit 201 also provides logic high control signals $FP_1$–$FP_7$, $CP_{11}$–$CP_{15}$, thereby turning off all of p-channel transistors P1–P7 and P11–P15. As a result, pad 202 is coupled to the ground terminal through the turned-on n-channel transistors. DCI circuit 201 selects the turned-on n-channel transistors to provide a particular resistance between the ground terminal and pad 202.

In the examples described below, the coarse n-channel transistors N11–N15 are turned on in a binary count order to provide a coarse resistance adjustment. Fine n-channel transistors N1–N7 are then enabled or disabled to provide a fine resistance adjustment. For example, fine n-channel transistors N1–N2 and coarse n-channel transistors N11 and N14 may be turned on when the $D_{IN}$ signal has a high value. In this example, the equivalent conductance of the n-channel portion of output driver circuit 200 would be equal to $X_N/2+X_N/2+X_N+8X_N$, or $10X_N$ siemens.

A chip will include a plurality of output driver circuits identical to output driver circuit 200. In general, one output driver circuit is selected to be a p-channel reference circuit, which is used to determine which p-channel transistors must be turned on to provide a desired resistance for a logic high output value or a desired transmission line termination. Similarly, one output driver circuit is selected to be an n-channel reference circuit, which is used to determine which n-channel transistors must be turned on to provide a desired resistance for a logic low output value or a desired transmission line termination. The determinations made by the p-channel and n-channel reference circuits are then transmitted to, and used by, other active output driver circuits.

Figure 3:
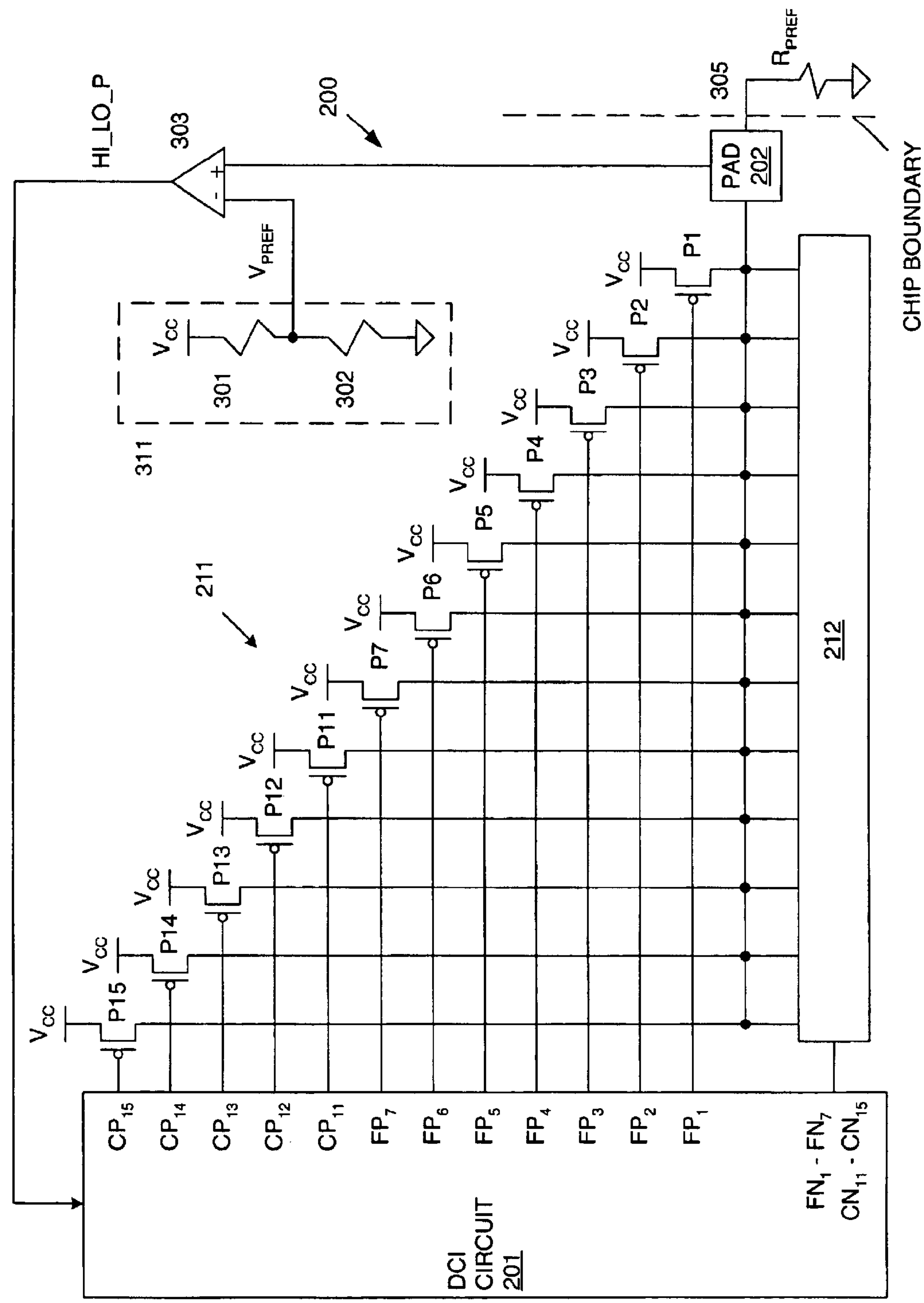
FIG. 3 is a circuit diagram illustrating the general manner in which p-channel transistors of an output driver circuit are matched with an external resistance.

FIG. 3 is a circuit diagram illustrating the general manner in which p-channel transistors P1–P7 and P11–P15 of output driver circuit 200 are controlled with respect to an external resistance 305. That is, FIG. 3 illustrates output driver circuit 200 being used as a p-channel reference circuit. As shown in FIG. 3, external resistor 305, having a resistance of $R_{PREF}$, is coupled between pad 202 and ground. Internally, pad 202 is also coupled to a positive input terminal of comparator 303. The negative input terminal of comparator 303 is coupled to receive a p-channel reference voltage $V_{PREF}$ from a reference voltage generator 311. In the described example, reference voltage generator 311 includes a pair of resistors 301–302 connected in series between the $V_{CC}$ voltage supply and the ground supply. Resistors 301–302 are connected at a common node, which provides the $V_{PREF}$ voltage. In the described example, resistors 301–302 each have a resistance of R ohms. As a result, the reference voltage $V_{PREF}$ has a value of approximately $V_{CC}/2$. The voltage on pad 202 will exhibit a voltage of approximately $V_{CC}/2$ when the equivalent on-resistance of the enabled p-channel transistors 211 is approximately equal to the resistance $R_{PREF}$ of reference resistor 305. In other examples, other resistance values and ratios can be used for resistors 301 and 302.

DCI circuit 201 operates as follows. Initially, all of the p-channel transistors P1–P7 and P11–P15 are turned off. As a result, the voltage on pad 202 is pulled down to a voltage less than the reference voltage $V_{PREF}$. As a result, comparator 303 provides a logic low HI_LO_P output signal.

DCI circuit 201 then asserts logic low control signals $FP_1$–$FP_3$, thereby turning on fine p-channel transistors P1–P3 ($3X_p$ siemens). If the equivalent resistance of fine p-channel transistors P1–P3 is greater than the resistance $R_{PREF}$, then the voltage on pad 202 will be less than the reference voltage $V_{PREF}$. As a result, comparator 303 will provide a logic low HI_LO_P output signal. In response, DCI circuit 201 de-asserts control signal $FP_3$ (high), such that only fine p-channel transistors P1–P2 are turned on ($2X_p$ siemens). If this results in a resistance greater than the resistance $R_{PREF}$, then DCI circuit 201 de-asserts control signal $FP_2$ such that fine p-channel transistor P1 is the only p-channel transistor turned on.

However, if the equivalent resistance of transistors P1–P3 is less than the resistance $R_{PREF}$, then the voltage on pad 202 will be greater than the reference voltage $V_{PREF}$. As a result, comparator 303 will provide a logic high HI_LO_P output signal. In response, DCI circuit 201 asserts a logic low control signal $CP_{11}$, thereby turning on coarse p-channel transistor $P_{11}$ ($X_p$ siemens) (along with fine p-channel transistors P1–P3).

If the equivalent resistance of fine p-channel transistors P1–P3 and coarse p-channel transistor P11 is still greater than the resistance $R_{PREF}$, then the voltage on pad 202 will still be less than the reference voltage $V_{PREF}$. As a result, comparator 303 will again provide a logic low HI_LO_P output signal. In response, DCI circuit 201 de-asserts coarse control signal $CP_{11}$ (high), and asserts coarse control signal $CP_{12}$ (low), thereby turning on coarse p-channel transistor P12 ($2X_p$ siemens) (along with fine p-channel transistors P1–P3).

If the equivalent resistance of fine p-channel transistors P1–P3 and coarse p-channel transistor P12 is still greater than the resistance $R_{PREF}$, then the voltage on pad 202 will still be less than the reference voltage $V_{PREF}$. As a result, comparator 303 will again provide a logic low HI_LO_P output signal. In response, DCI circuit 201 asserts both coarse control signals $CP_{11}$ and $CP_{12}$ (low), thereby turning on coarse p-channel transistors P11–P12 ($3X_p$ siemens) (along with fine p-channel transistors P1–P3).

This sequence continues, with coarse p-channel transistors P11–P15 being turned on in a binary count order (e.g., $1X_p$, $2X_p$, $3X_p$, $4X_p$, $5X_p$, $6X_p$ . . . ) until the equivalent resistance of fine p-channel transistors P1–P3 and the enabled coarse p-channel transistors is less than the reference resistance $R_{PREF}$. At this time, the voltage on pad 202 will be greater than reference voltage $V_{PREF}$, thereby providing a logic high HI_LO_P signal. In response, DCI circuit 201 returns the coarse p-channel transistors to the binary count prior to the binary count that caused the HI_LO_P signal to go high.

For example, if the equivalent resistance of fine p-channel transistors P1–P3 and coarse p-channel transistors P12 and P13 ($6X_p$) is less than reference resistance $R_{PREF}$, then a logic high HI_LO_P signal will be generated. In response, DCI circuit 201 de-asserts control signal $CP_{12}$ (high), thereby turning off coarse p-channel transistor P12. DCI circuit 201 also asserts a logic low control signals $CP_{11}$ and $CP_{13}$, thereby turning on coarse p-channel transistors P11 and P13 ($5X_p$). Coarse p-channel transistors P11 and P13 are thereby selected to be the only turned-on coarse p-channel transistors for the duration of the present operating scheme. All further adjustments in the on-resistance of p-channel transistors 211 are made by enabling and disabling fine p-channel transistors P1–P7.

Note that fine p-channel transistors P1–P7 are set near the midpoint of their range by initially turning on three of these transistors P1–P3 while the coarse p-channel transistors are selected. This enables the fine p-channel transistors P1–P7 to maintain an appropriate operating range when the resistance needs to be increased or decreased.

For example, if coarse p-channel transistors P11 and P13 and fine p-channel transistors P1–P3 present an equivalent resistance that is greater than reference resistance $R_{PREF}$, then comparator 303 again provides a logic low HI_LO_P signal to DCI circuit 201. Because the coarse transistors P11 and P13 have been set, DCI circuit 201 will only adjust the fine p-channel transistors at this time. Thus, DCI circuit 201 asserts the $FP_4$ control signal (in addition to the $FP_1$–$FP_3$, $CP_{11}$ and $CP_{13}$ signals), thereby turning on fine p-channel transistor P4 (in addition to fine p-channel transistors P1–P3 and coarse p-channel transistors P11 and P13). If the equivalent resistance of p-channel transistors P1–P4, P11 and P13 is less than reference resistance $R_{PREF}$, then comparator 303 will provide a high HI_LO_P signal. In response, DCI circuit 201 will subsequently turn off fine p-channel transistor P4.

If the equivalent resistance of fine p-channel transistors P1–P4 and coarse p-channel transistors P11 and P13 is greater than reference resistance $R_{PREF}$, then comparator 303 will again provide a low HI_LO_P output signal. In response, DCI circuit 201 will assert the $FP_5$ signal (in addition to the $FP_1$–$FP_4$, $CP_{11}$ and $CP_{13}$ signals), thereby turning on fine p-channel transistor P5 (in addition to fine p-channel transistors P1–P4 and coarse p-channel transistors P11 and P13). If the equivalent resistance of p-channel transistors P1–P5, P11 and P13 is less than (or greater than) reference resistance $R_{PREF}$, then comparator 303 will provide a high (or low) HI_LO_P output signal. Operation continues in this manner, with the fine p-channel transistors being adjusted as required. As a result, the equivalent resistance of the turned on p-channel transistors will have a predetermined relationship with respect to the reference resistance $R_{PREF}$. Advantageously, the number of turned on p-channel transistors will be further modified to in response to the operating conditions of the system (e.g., changes in temperature and/or voltage) to maintain the equivalent resistance.

Alternatively, instead of the linear search algorithm described above, a binary search algorithm can be used to determine the P or N channel transistors to be turned on.

As described in more detail below, information identifying the enabled transistors in the p-channel reference circuit (FIG. 3) is transmitted to other output driver circuits, such that these other output driver circuits are operated by enabling the same transistors as the p-channel reference circuit.

Figure 4:
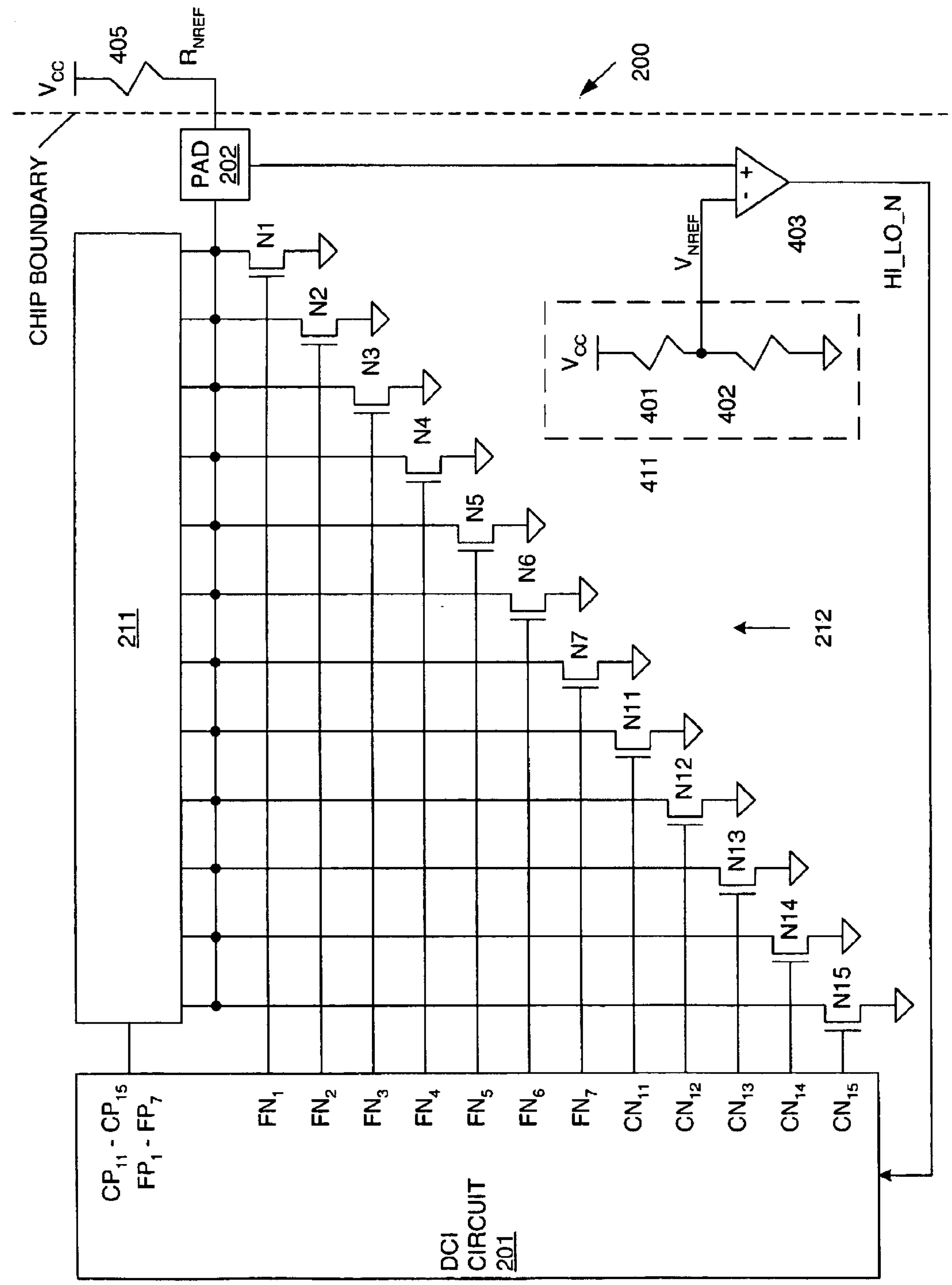
FIG. 4 is a circuit diagram illustrating the general manner in which n-channel transistors of an output driver circuit are matched with an external resistance.

FIG. 4 is a circuit diagram illustrating the, general manner in which n-channel transistors N1–N7 and N11–N15 of output driver circuit 200 are matched with an external resistance 405. That is, FIG. 4 illustrates output driver circuit 200 being used as an n-channel reference circuit. As shown in FIG. 4, external resistor 405, having a resistance of $R_{NREF}$, is coupled between pad 202 and the $V_{CC}$ supply terminal. Internally, pad 202 is also coupled to the positive input terminal of comparator 403. The negative input terminal of comparator 403 is coupled to receive a reference voltage $V_{NREF}$ from a reference voltage generator 411. In the described example, reference voltage generator 411 includes a pair of resistors 401–402 connected in series between the $V_{CC}$ supply terminal and the ground terminal. Resistors 401–402 are connected at a common node, which provides the $V_{NREF}$ voltage. In the described example, resistors 401–402 each have a resistance of R ohms. As a result, the reference voltage $V_{NREF}$ has a value of approximately $V_{CC}/2$. The voltage on pad 202 will exhibit a voltage of approximately $V_{CC}/2$ when the resistance provided by the turned on n-channel transistors is approximately equal to the resistance $R_{NREF}$ of reference resistor 405.

DCI circuit 201 selects the n-channel transistors to be enabled in the same manner that the p-channel transistors are selected, as described above in connection with FIG. 3. Thus, all of the n-channel transistors N1–N7 and N11–N15 are initially turned off by DCI circuit 201. Fine n-channel transistors N1–N3 are then turned on by DCI circuit 201. If necessary, coarse n-channel transistors N11–N15 are turned on in a binary count order until comparator 403 provides a logic low HI_LO_N output signal. Upon detecting the logic low HI_LO_N output signal, DCI circuit 201 enables the coarse n-channel transistors corresponding with the previous binary count, and makes all further adjustments using the fine n-channel transistors N1–N7.

As described in more detail below, information identifying the enabled transistors in the n-channel reference circuit (FIG. 4) is transmitted to other output driver circuits, such that these other output driver circuits are operated by enabling the same transistors as the n-channel reference circuit. As a result, the output driver circuits will be referenced to external reference resistances. This advantageously optimizes the operation of the output driver circuits.

Adjustments made by DCI circuit 201 can be dynamically enabled or disabled. For example, after DCI circuit 201 has determined which coarse and fine p-channel transistors should be turned on, and which coarse and fine n-channel transistors should be turned off, DCI circuit 201 can be prevented from making further changes to the enabled/disabled transistors. Thus, if DCI circuit 201 initially determines that p-channel transistors P1–P3, P13 and P15 should be turned on, then further adjustments by DCI circuit 201 can be disabled, thereby causing this p-channel determination to be used, without change, until the DCI circuit 201 is re-enabled.

In the example described above, both of the reference voltages $V_{PREF}$ and $V_{NREF}$ have a value of approximately $V_{CC}/2$, thereby causing the p-channel transistors to be referenced to reference resistance 305 ($R_{PREF}$) and the n-channel transistors to be referenced to reference resistance 405 ($R_{NREF}$). In another example, the reference voltages $V_{PREF}$ and $V_{NREF}$ can be modified to have values of approximately $2V_{CC}/3$ and $V_{CC}/3$, respectively. This effectively references the p-channel transistors to ½ of the reference resistance 305 ($R_{PREF}$), and references the n-channel transistors to ½ of the reference resistance 405 ($R_{NREF}$). In other examples, the reference voltages $V_{PREF}$ and $V_{NREF}$ can be modified to have other values, such that the turned on transistors will have different relationships with respect to the reference resistors 305 and 405. This advantageously allows reference resistors having different values to be used.

In another example, external reference resistor 405 can be eliminated. In this example, the reference resistance for the n-channel reference circuit is provided by turning on the p-channel transistors 211 determined by the p-channel reference circuit in response to reference resistor 305. Thus, if the p-channel reference circuit determines that coarse p-channel transistors P13 and P15 and fine p-channel transistors P1–P4 must be turned on to provide the desired correspondence with reference resistor 305, then these transistors P1–P4, P13 and P15 are turned on in the n-channel reference circuit. The n-channel reference circuit then determines which n-channel transistors 212 should be turned on to correspond with the turned on p-channel transistors in the output driver circuit. In this manner, the n-channel transistors 212 turned on by the n-channel reference circuit are indirectly referenced to the external reference resistance $R_{PREF}$ 305.

In a similar manner, external reference resistor 305 can be eliminated. In this example, the n-channel reference circuit determines which n-channel transistors should be turned on in response to the external reference resistance 405 ($R_{NREF}$). This information is then transmitted to the p-channel reference circuit, such that the same n-channel transistors are turned on in the p-channel reference circuit. The p-channel reference circuit then determines which p-channel transistors should be turned on to correspond with the turned on n-channel transistors. In this manner, the p-channel transistors turned on by the p-channel reference circuit are indirectly referenced to the external reference resistance 405.

As described above, adjusting the p-channel and n-channel transistors to be enabled in an output driver circuit in response to reference resistances advantageously enables the output driver circuit to exhibit a particular resistance with respect to reference resistors. An output driver circuit that is adjusted in this manner will be referred to as a digitally controlled impedance (DCI) output driver circuit.

Figure 5A:
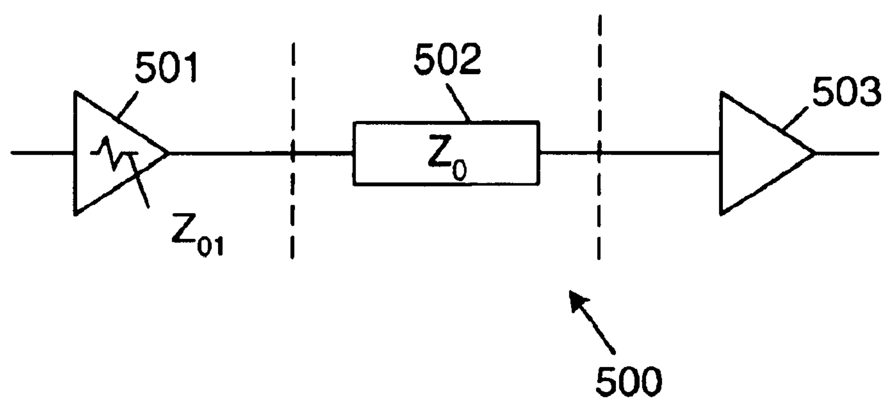
FIG. 5A is a circuit diagram illustrating a DCI output driver circuit that has a digitally controlled impedance.

FIG. 5A is a circuit diagram of a system 500 that includes a DCI output driver circuit 501, an input buffer 503, and a bus line 502 that carries an output signal from DCI output driver circuit 501 to input buffer 503. Bus line 502 exhibits an impedance $Z_0$. DCI output driver circuit 501 can be digitally controlled to exhibit an impedance $Z_{01}$, which has a predetermined correspondence with the impedance $Z_0$ of bus line 502.

The DCI circuit 201 can also be bypassed, such that some or all of the p-channel transistors 211 are turned on to provide a logic high output signal, and some or all of the n-channel transistors 212 are turned on to provide a logic low output signal.

Figure 5B:
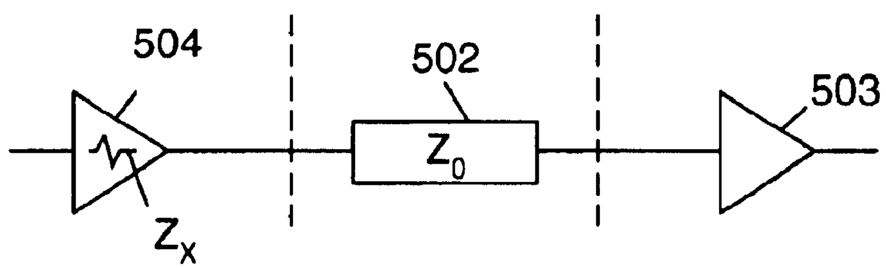
FIG. 5B is a circuit diagram illustrating another embodiment of an output driver circuit.

FIG. 5B is a circuit diagram illustrating DCI output driver circuit 501, wherein the DCI circuit 201 present in DCI output driver circuit 501 has been bypassed. Although output driver circuit 504 will exhibit an impedance $Z_X$, this impedance is not controlled to have a particular correspondence with the impedance $Z_0$ of line 502.

DCI circuit 201 can also be controlled to turn on user-selected p-channel transistors to provide a logic high output signal, and to turn on user-selected n-channel transistors to provide a logic low output signal. For example, DCI circuit 201 can be controlled by a user to turn on only the coarse p-channel transistors P11–P15 to provide a logic high output signal, and to turn on only the coarse n-channel transistors N11–N15 to provide a logic low output signal, regardless of the external impedance $Z_0$. This alternative is described in more detail in commonly owned, U.S. Pat. No. 5,877,632.

DCI output driver circuits can also be controlled to provide termination resistances to allow bi-directional signaling while using an asymmetrical unidirectional bus I/O standard, such as a terminated HSTL Class 1 bus I/O standard.

Figure 6A:
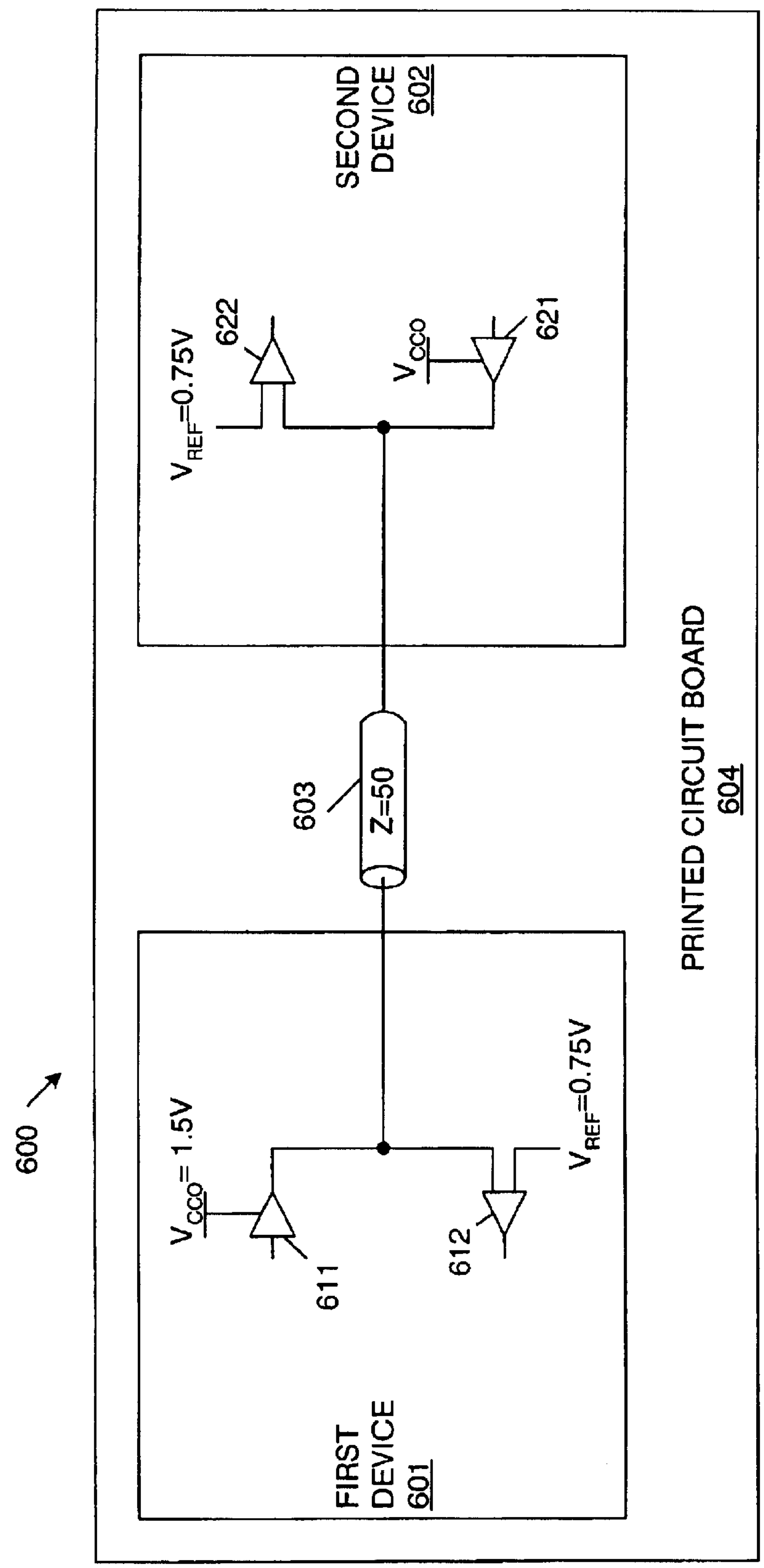
FIG. 6A is a circuit diagram illustrating a high speed digital system, which operates in accordance with the terminated HSTL Class I standard in accordance with one embodiment of the present invention.

FIG. 6A is a circuit diagram illustrating a system 600 that includes first device 601, second device 602 and trace 603, which has an impedance Z of 50 Ohms. Trace 603 is located on printed circuit board 604 in the described embodiment. First device 601 includes an I/O buffer having a DCI output driver circuit 611 and an input buffer 612. Similarly, second device 602 includes an I/O buffer having a DCI output driver circuit 621 and an input buffer 622. DCI output driver circuits 611 and 621 are supplied by a $V_{CCO}$ voltage of 1.5 Volts, and input buffers 612 and 622 are referenced to a voltage of 0.75 Volts. As described in more detail below, DCI output driver circuits 611 and 621 are controlled to provide termination resistances to implement the terminated HSTL Class 1 bus I/O standard of FIG. 1.

Figure 6B:
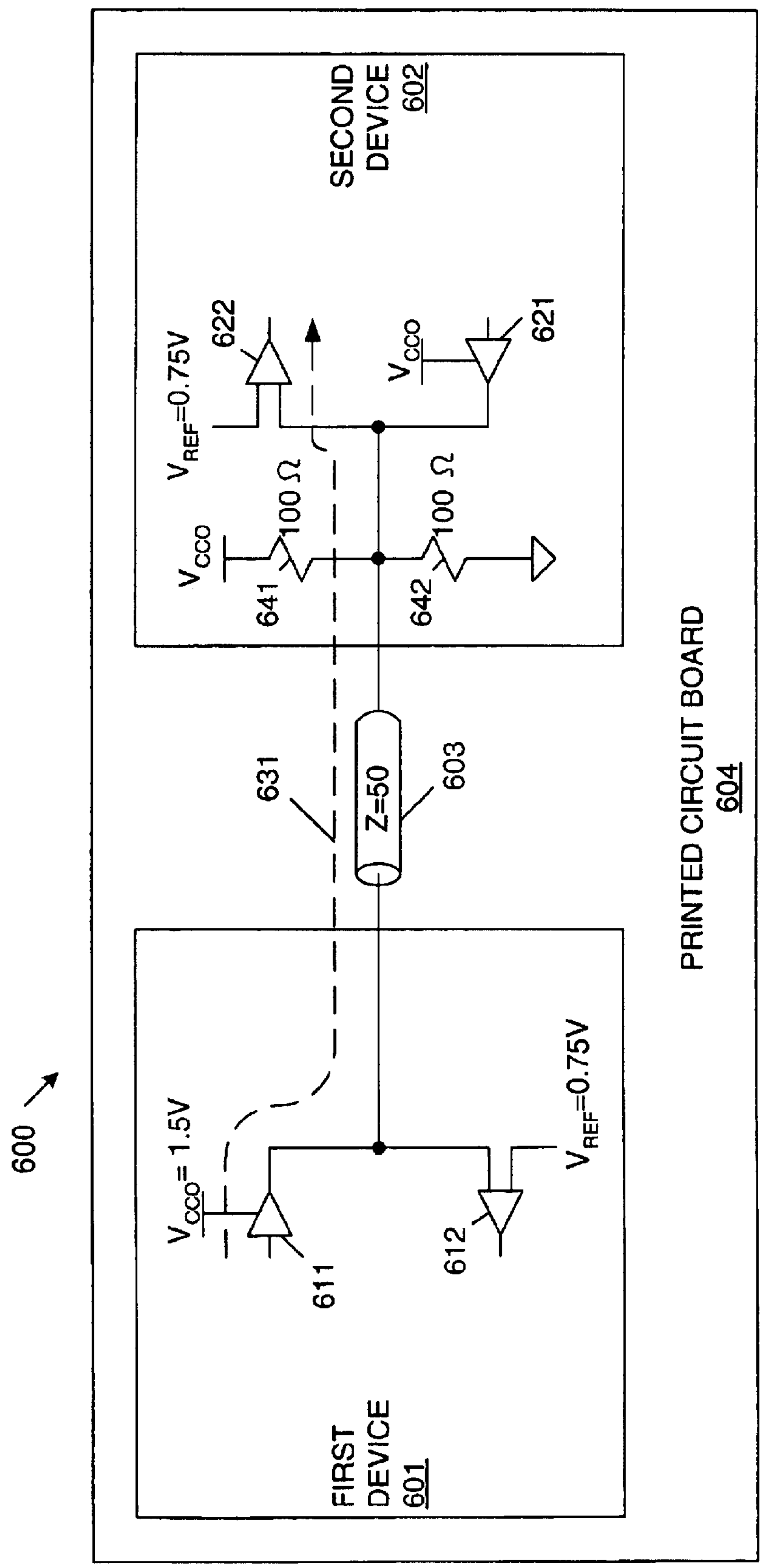
FIGS. 6B–6C are circuit diagrams illustrating the manner in which the system of FIG. 6A provides termination resistors using the digitally controlled impedances of output driver circuits, thereby eliminating the need for external termination resistors.

FIG. 6B is a circuit diagram of system 600, when this system is configured to drive a signal from first device 601 to second device 602 in accordance with the terminated HSTL Class 1 bus I/O standard. The signal path is illustrated by dashed line 631 in FIG. 6B. In this configuration, DCI output driver circuit 611 is configured to drive a signal to trace 603. Although DCI output driver circuit 611 will exhibit some impedance, this impedance is minimized, and is not controlled to have a particular correspondence with the impedance $Z_0$ of trace 603. For example, the required number of the p-channel transistors P1–P15 in DCI output driver circuit 611 to achieve the necessary drive strength may be turned on to drive a high output signal, and the required number of the n-channel transistors N1–N15 to drive a low output signal may be turned on to drive a low output signal.

Within second device 602, DCI output driver circuit 621 is tri-stated, such that this circuit 621 is not responsive to signals applied to its input terminal. However, the DCI circuit 201 in DCI output driver circuit 621 is controlled to turn on a first subset of the p-channel transistors P1–P15, thereby introducing a termination resistance 641 between trace 603 and the $V_{CCO}$ supply voltage. DCI circuit 201 in DCI output driver circuit 621 is further controlled to turn on a first subset of the n-channel transistors N1–N15, thereby introducing a termination resistance 642 between trace 603 and the ground supply voltage. In the described example, termination resistors 641 and 642 are each controlled to have a resistance of 100 ohms, using the methods described herein.

Figure 1:
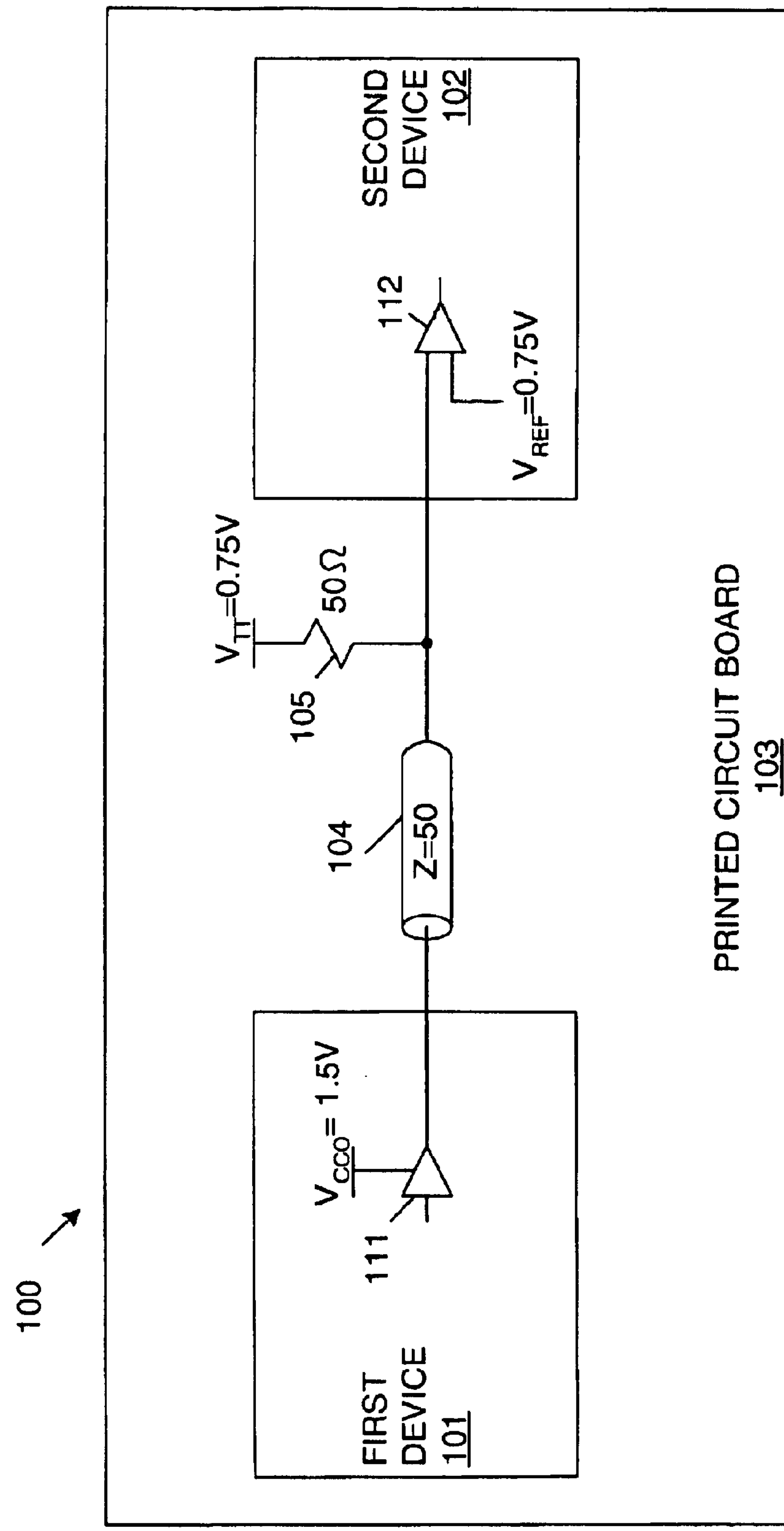
FIG. 1 is a circuit diagram illustrating a conventional asymmetric unidirectional bus I/O standard.

Termination resistors 641 and 642 provide the equivalent of a 50 ohm termination resistor coupled between trace 603 and a supply voltage of $V_{CCO}/2$. Thus, termination resistors 641 and 642 are the equivalent of termination resistor 105 in system 100 (FIG. 1). In this manner, system 600 conforms to the terminated HSTL Class 1 bus I/O standard for signals transmitted from first device 601 to second device 602.

Figure 6C:
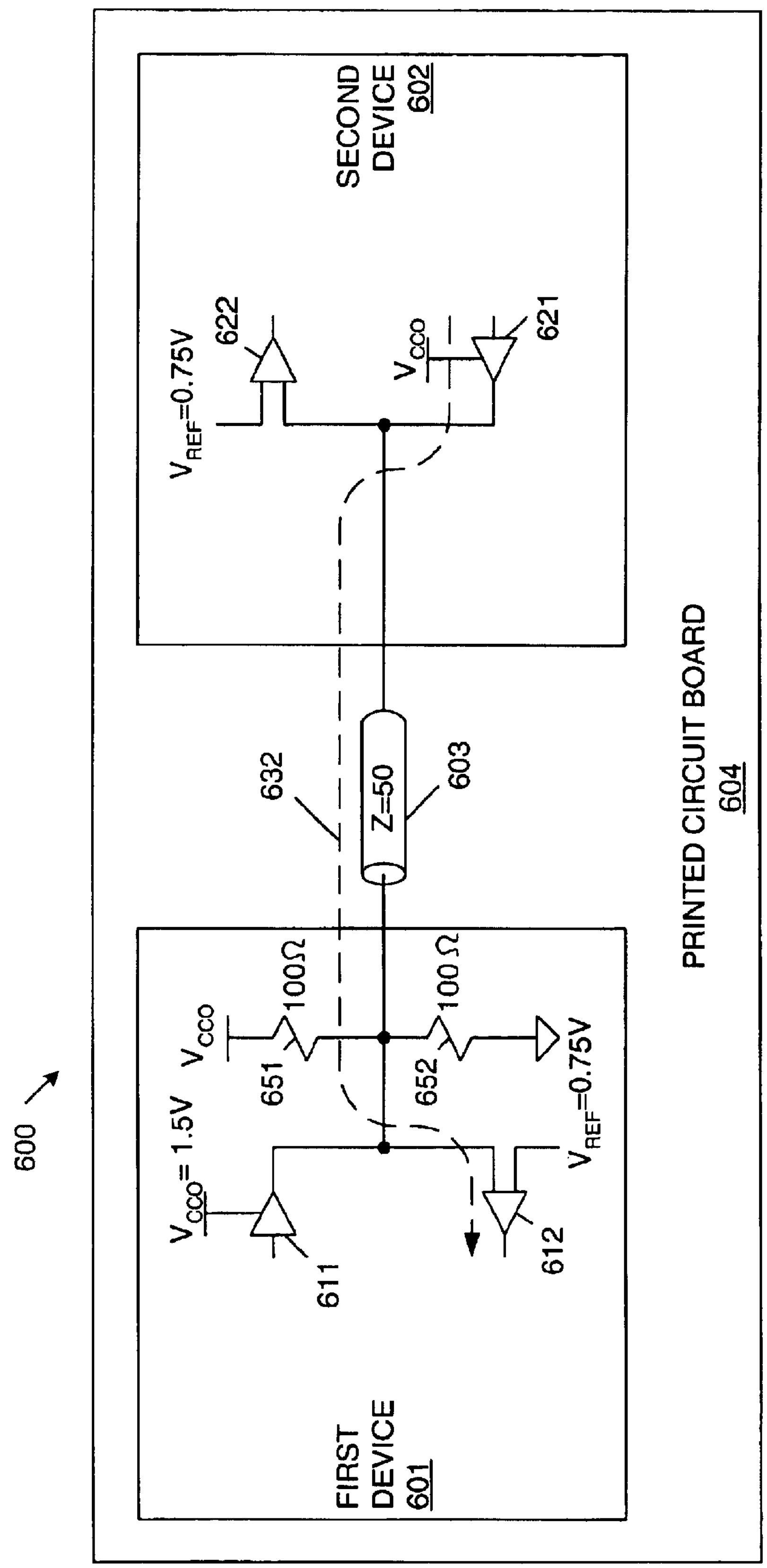

FIG. 6C is a circuit diagram of system 600, when this system is configured to drive a signal in the opposite direction, from second device 602 to first device 601, in accordance with the terminated HSTL Class 1 bus I/O standard. The signal path is illustrated by dashed line 632 in FIG. 6C. In this configuration, DCI output driver circuit 621 is configured to drive a signal to trace 603. Although DCI output driver circuit 621 will exhibit some impedance, this impedance is minimized, and is not controlled to have a particular correspondence with the impedance $Z_0$ of trace 603. Thus, DCI output driver circuit 621 is operated in the same manner as DCI output driver circuit 611 in FIG. 6B.

Within first device 601, DCI output driver circuit 611 is tri-stated, such that this circuit 611 is not responsive to signals applied to its input terminal. DCI output driver circuit 611 is controlled in the same manner previously described for DCI output driver circuit 621 in FIG. 6B. That is, the p-channel transistors in DCI output driver circuit 611 are controlled to introduce a 100 ohm termination resistance 651 between the $V_{CCO}$ supply terminal and trace 603, and the n-channel transistors in DCI output driver circuit 611 are controlled to introduce a 100 ohm termination resistance 652 between trace 603 and the ground terminal. Termination resistors 651 and 652 provide the equivalent of a 50 ohm termination resistor coupled between trace 603 and a supply voltage of $V_{CCO}/2$. Thus, termination resistors 651 and 652 are the equivalent of termination resistor 105 in system 100 (FIG. 1). In this manner, system 600 conforms to the terminated HSTL Class 1 bus I/O standard for signals transmitted from second device 602 to first device 601.

Thus, by controlling the configuration of DCI output driver circuits 611 and 621, bi-directional signal transfer can be performed on trace 603, while conforming with the terminated HSTL Class 1 bus I/O standard in both directions.

As illustrated in FIGS. 6B and 6C, termination resistors 641–642 and 651–652 can be implemented using the digitally controlled impedance of output driver circuits 621 and 611, respectively, thereby eliminating the need for external termination resistors, such as external termination resistor 105 (FIG. 1). To determine the p-channel and n-channel transistors to be turned on to implement termination resistors 641–642 and 651–652, the DCI circuits in output driver circuits 621 and 611 are referenced to a known resistance in response to reference voltages $V_{PREF}$ and $V_{NREF}$ having respective predetermined values. Advantageously, the termination resistance is controlled with respect to external reference resistors and can be adjusted for changes in temperature, voltage and/or process.

The terminated HSTL Class III standard is another asymmetrical bus I/O termination standard that can be implemented in a bi-directional manner. The terminated HSTL Class III standard is identical to the terminated HSTL Class I standard, except that a reference voltage $V_{REF}$ of 0.9 Volts is used in the terminated HSTL Class III standard. Thus, the terminated HSTL Class III standard can be implemented in the same manner described in FIGS. 6A–6C.

Other asymmetrical bus I/O termination standards that can be implemented in a bi-directional manner in accordance with the present invention include the terminated SSTL3_I standard, the terminated SSTL3_II standard, the SSTL2_I standard and the SSTL2_II standard. Note that SSTL stands for stub series terminated logic.

Figure 7A:
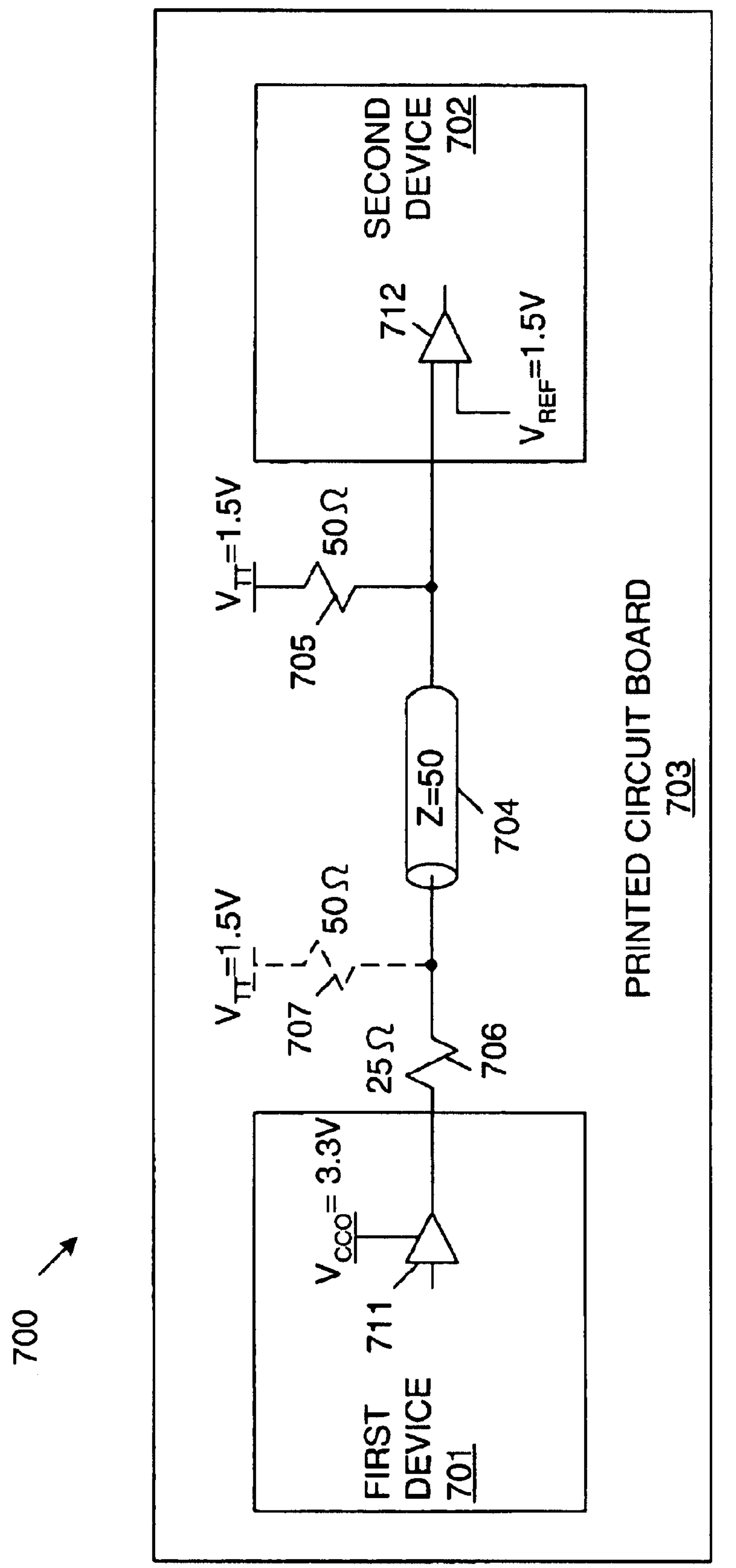
FIG. 7A is a circuit diagram illustrating a conventional high-speed digital system, which operates in accordance with the terminated SSTL3_I standard.

FIG. 7A is a circuit diagram illustrating a conventional high speed digital system 700, which operates in accordance with the terminated SSTL3_I standard. System 700 includes a first device 701 having an output driver circuit 711 (which is supplied by a $V_{CCO}$ voltage equal to 3.3 Volts) and a second device 702 having an input buffer 712 (which operates in response to a reference voltage $V_{REF}$ equal to 1.5 Volts). An electrically conductive trace 704 located on printed circuit board 703 couples output driver 711 of first device 701 to input buffer 712 of second device 702. In accordance with the terminated SSTL3_1 standard, trace 704 has an impedance of 50 ohms. An external dedicated resistor 705 is located on printed circuit board 703, and connected to the end of trace 704 located adjacent to second device 702. In accordance with the terminated SSTL3_I standard, resistor 705 is selected to have a matching resistance of 50 ohms, and is biased with a voltage $V_{TT}$ of 1.5 Volts. Another external dedicated resistor 706 is located in series with trace 704 on printed circuit board 703, adjacent to first device 701. In accordance with the terminated SSTL3_I standard, resistor 706 has a resistance of 25 ohms.

Signals are transmitted in a unidirectional manner from output driver 711 to input buffer 712 via trace 704. Termination resistors 705 and 706 absorb or prevent signal reflections, which may otherwise interfere with the function of system 700.

The SSTL2_I standard is substantially identical to the SSTL3_I standard, except that the $V_{CCO}$, $V_{TT}$ and $V_{REF}$ voltages have values of 2.5 Volts, 1.25 Volts and 1.25 Volts, respectively, in the SSTL2_I standard.

The SSTL3_II standard is substantially identical to the SSTL3_I standard, except that a 50 ohm resistor, shown as resistor 707 in dashed lines in FIG. 7A, is provided between trace 704 and the $V_{TT}$ supply terminal at the source end of trace 704.

The SSTL2_II standard is substantially identical to the SSTL3_II standard, except that the $V_{CCO}$, $V_{TT}$ and $V_{REF}$ voltages have values of 2.5 Volts, 1.25 Volts and 1.25 Volts, respectively, in the SSTL2_II standard.

Figure 7B:
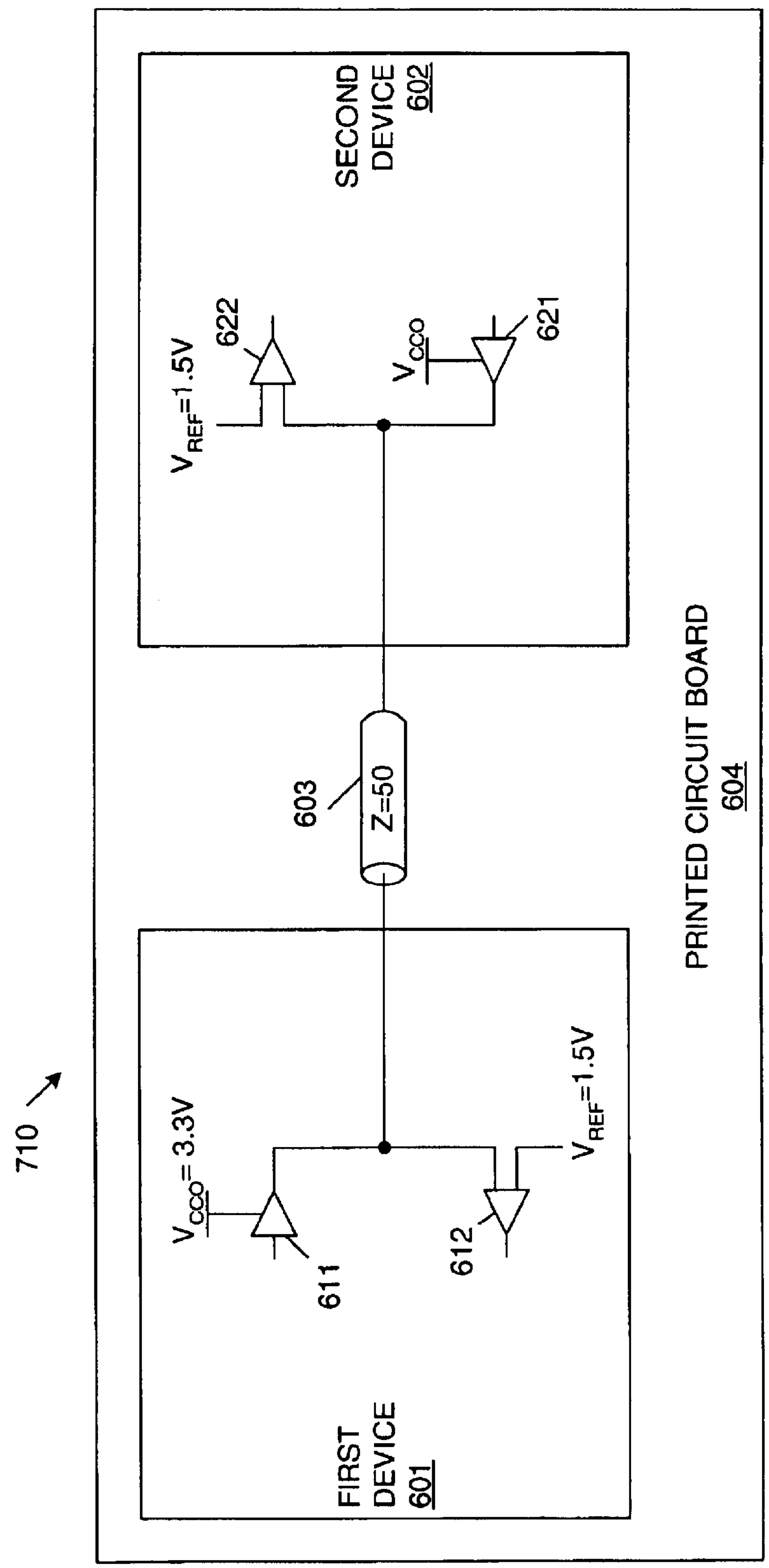
FIG. 7B is a circuit diagram illustrating a high-speed digital system, which operates in accordance with the terminated SSTL3_I standard in accordance with one embodiment of the present invention.

FIG. 7B is a circuit diagram illustrating system 710, which is substantially identical to above-described system 600 (FIG. 6A). Similar elements in FIGS. 6A and 7B are labeled with similar reference numbers. Thus, system 710 includes first device 601, second device 602, trace 603, printed circuit board 604, DCI output driver circuits 611 and 621, and input buffers 612 and 622. The difference between system 710 and system 600 is the voltages used to supply the various elements. Thus, in system 710, the $V_{CCO}$ and $V_{REF}$ voltages have values of 3.3 Volts and 1.5 Volts, respectively.

Figure 7C:
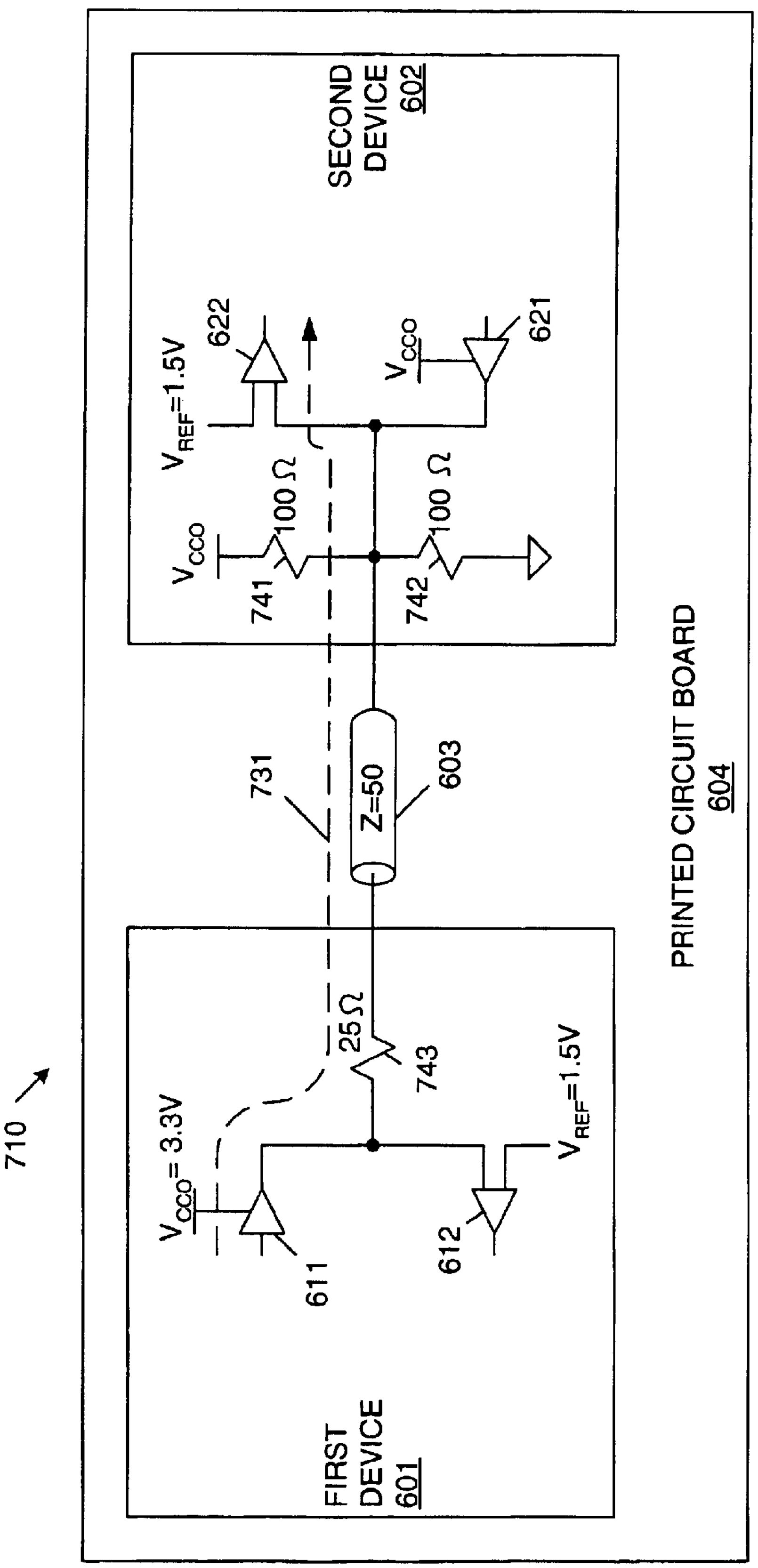
FIGS. 7C–7D are circuit diagrams the manner in which the system of FIG. 7B provides termination resistors using the digitally controlled impedances of output driver circuits, thereby eliminating the need for external termination resistors.

In FIG. 7C, system 710 is configured to drive a signal from first device 601 to second device 602 in accordance with the terminated SSTL3_I standard. The signal path is illustrated by dashed line 731 in FIG. 7C. In this configuration, DCI output driver circuit 611 is configured to drive a signal to trace 603. The impedance of DCI output driver circuit 611 is controlled to exhibit a series resistance 743 of 25 ohms in accordance with the description provided herein. In this manner, DCI output driver circuit 611 provides a termination resistor 743 that is equivalent to termination resistor 706 in system 700 (FIG. 7A).

Within second device 602, DCI output driver circuit 621 is tri-stated, such that this circuit 621 is not responsive to signals applied to its input terminal. DCI output driver circuit 621 is controlled in the same manner previously described for DCI output driver circuit 621 in FIG. 6B. That is, the p-channel transistors in DCI output driver circuit 621 are controlled to introduce a 100 ohm termination resistance 741 between the $V_{CCO}$ supply terminal and trace 603, and the n-channel transistors in DCI output driver circuit 621 are controlled to introduce a 100 ohm termination resistance 742 between trace 603 and the ground terminal. Termination resistors 741 and 742 provide the equivalent of a 50 ohm termination resistor coupled between trace 603 and a supply voltage of $V_{CCO}/2$. Thus, termination resistors 741 and 742 are the equivalent of termination resistor 705 in system 700

(FIG. 7A). In this manner, system 710 conforms to the terminated SSTL3_I standard for signals transmitted from first device 601 to second device 602.

In this manner, system 710 conforms to the terminated SSTL3_I standard for signals transmitted from first device 601 to second device 602.

Figure 7D:
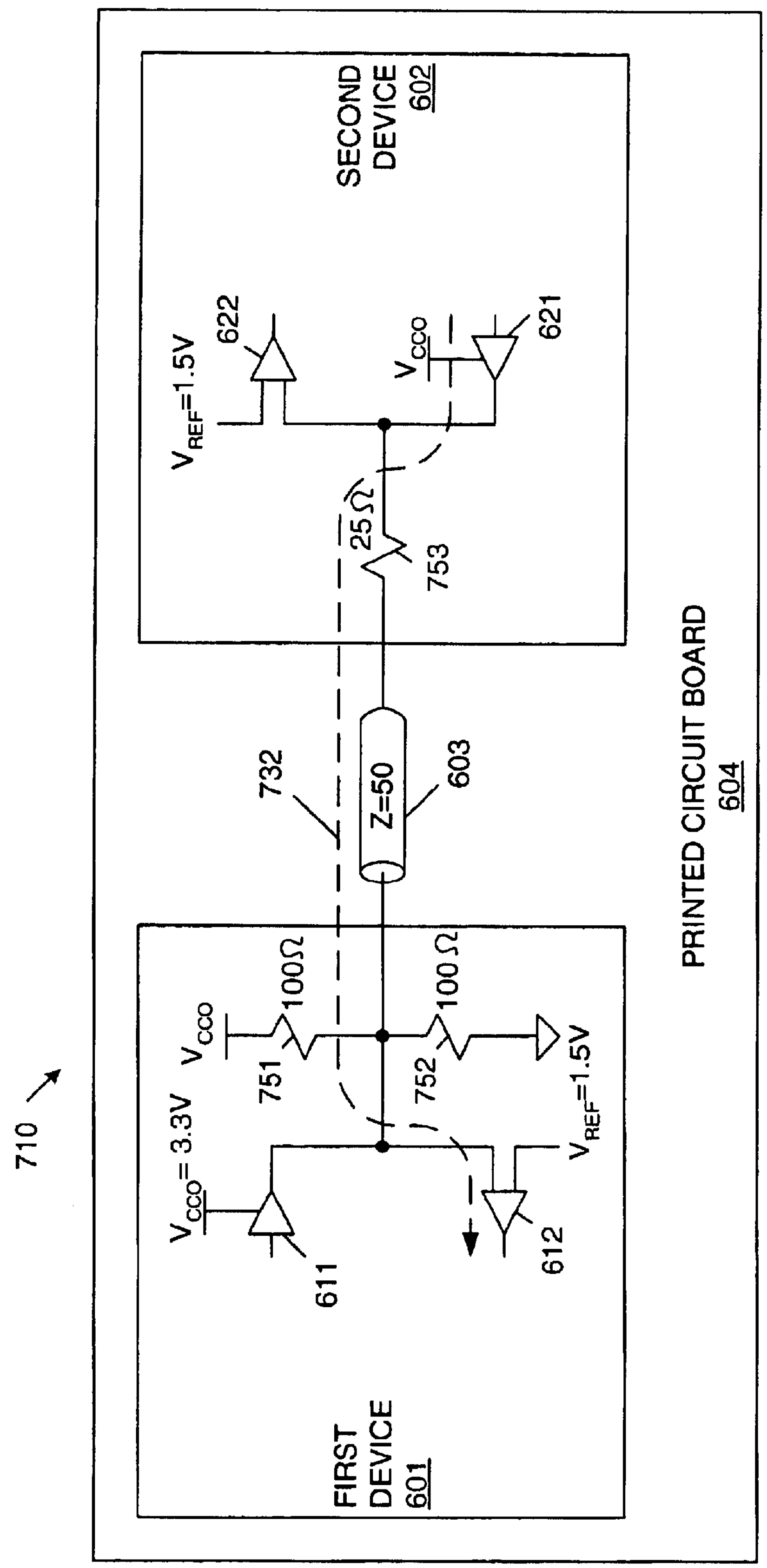

FIG. 7D is a circuit diagram illustrating the configuration of system 710 while transmitting a signal from second device 602 to first device 601 along path 732. DCI output driver circuit 611 is controlled to provide termination resistances 751 and 752 in accordance with the above-described procedures. Similarly, DCI output driver circuit 621 is controlled to provide termination resistance 753 in accordance with the above-described procedures.

Thus, by controlling the configuration of DCI output driver circuits 611 and 621, bi-directional signal transfer can be performed on trace 603, while conforming with the terminated SSTL3_I standard in both directions.

In an alternate embodiment, the impedance of DCI output driver circuit 611 can further be controlled to exhibit an additional 50 ohm resistance between trace 603 and the $V_{TT}$ supply terminal, during signal transfer from first device 601 to second device 602. In this manner, a termination resistor equivalent to termination resistor 707 in system 700 (FIG. 7A) is provided to emulate a terminated SSTL3_II standard.

To provide symmetry, the impedance of DCI output driver circuit 621 can be controlled to exhibit an additional 50 ohm resistance between trace 603 and the $V_{TT}$ supply terminal, during signal transfer from second device 602 to first device 601. In this manner, a termination resistor equivalent to termination resistor 707 in system 700 (FIG. 7A) is provided to emulate a terminated SSTL3_II standard.

As described above, the required termination resistances are dynamically provided by the DCI output driver circuit(s) in the communicating I/O blocks only when these termination resistances are needed. As a result, more than two I/O blocks may be coupled to the same trace, without requiring a dedicated external termination resistor for each of the I/O blocks. In the past, such dedicated external termination resistors would have been required, thereby limiting or eliminating the ability to provide communication between certain I/O blocks.

The variations illustrated in FIGS. 5A–5B, 6A–6C and 7A–7D, as well as the manner of transmitting information from the p-channel and n-channel reference circuits to other output driver circuits, will now be described in more detail.

Figure 8:
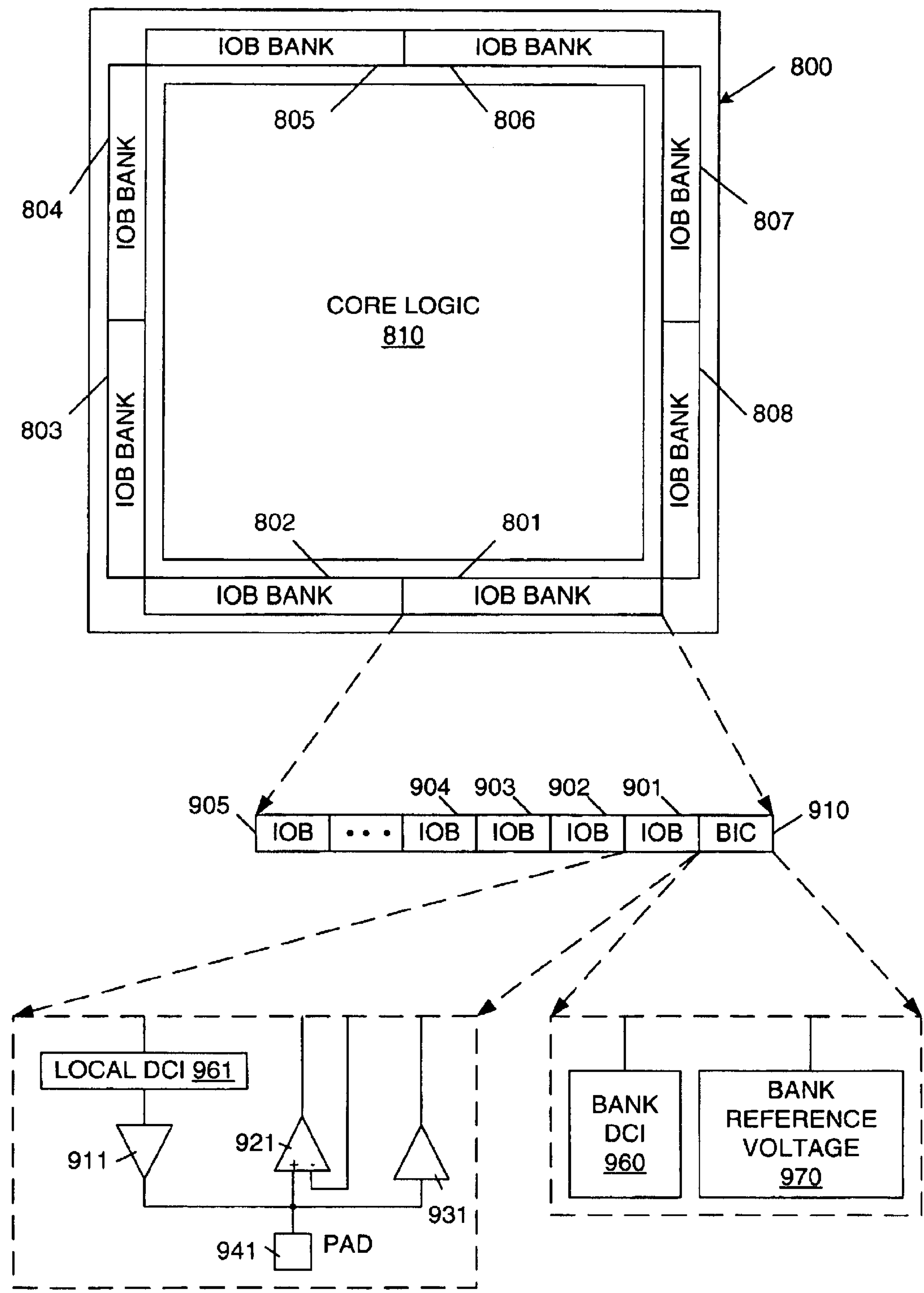
FIG. 8 is a block diagram of an integrated circuit chip, which includes circuitry used to implement one embodiment of the present invention.

FIG. 8 is a block diagram of an integrated circuit chip 800. IC chip 800 includes eight input/output block (IOB) banks 801–808 and core logic 810. IOB banks 801–808 are substantially identical. Core logic 810 includes an array of configurable logic blocks and programmable interconnect circuitry. However, other core logic is possible. In general, IOB banks 801–808 provide an interface between core logic 810 and circuitry external to chip 800.

In FIG. 8, two IOB banks are located along each edge of IC chip 800, with each IOB bank having 20 to 150 IOBS. An exploded view illustrates that IOB bank 801 includes a plurality of IOBs 901–905 and a bank impedance control (BIC) circuit 910. A further exploded view illustrates that IOB 901 includes output driver circuit 911, comparator 921, input buffer circuit 931, I/O pad 941 and local digitally controlled impedance (DCI) circuit 961. Yet another exploded view illustrates that bank impedance control circuit 910 includes a bank digitally controlled impedance (DCI) circuit 960 and bank reference voltage generator 970. As described in more detail below, local DCI circuit 961 and bank DCI circuit 960 combine to perform the functions of DCI circuit 201 (FIGS. 2–4). As also described in more detail below, bank reference voltage generator 970 provides the reference voltages that are used by IOBs 901–905. Thus, bank reference voltage generator 970 performs the functions of reference voltage circuits 311 and 411 (FIGS. 3 and 4).

Alternately, only one bank impedance control circuit 910 may be provided for the entire chip 800. In this case, bank impedance control circuit 910 provides the necessary control for all of the local DCI circuits on chip 800. Alternately, there may be multiple bank impedance control circuits, which are capable of controlling one or more IOB banks.

Figure 9:
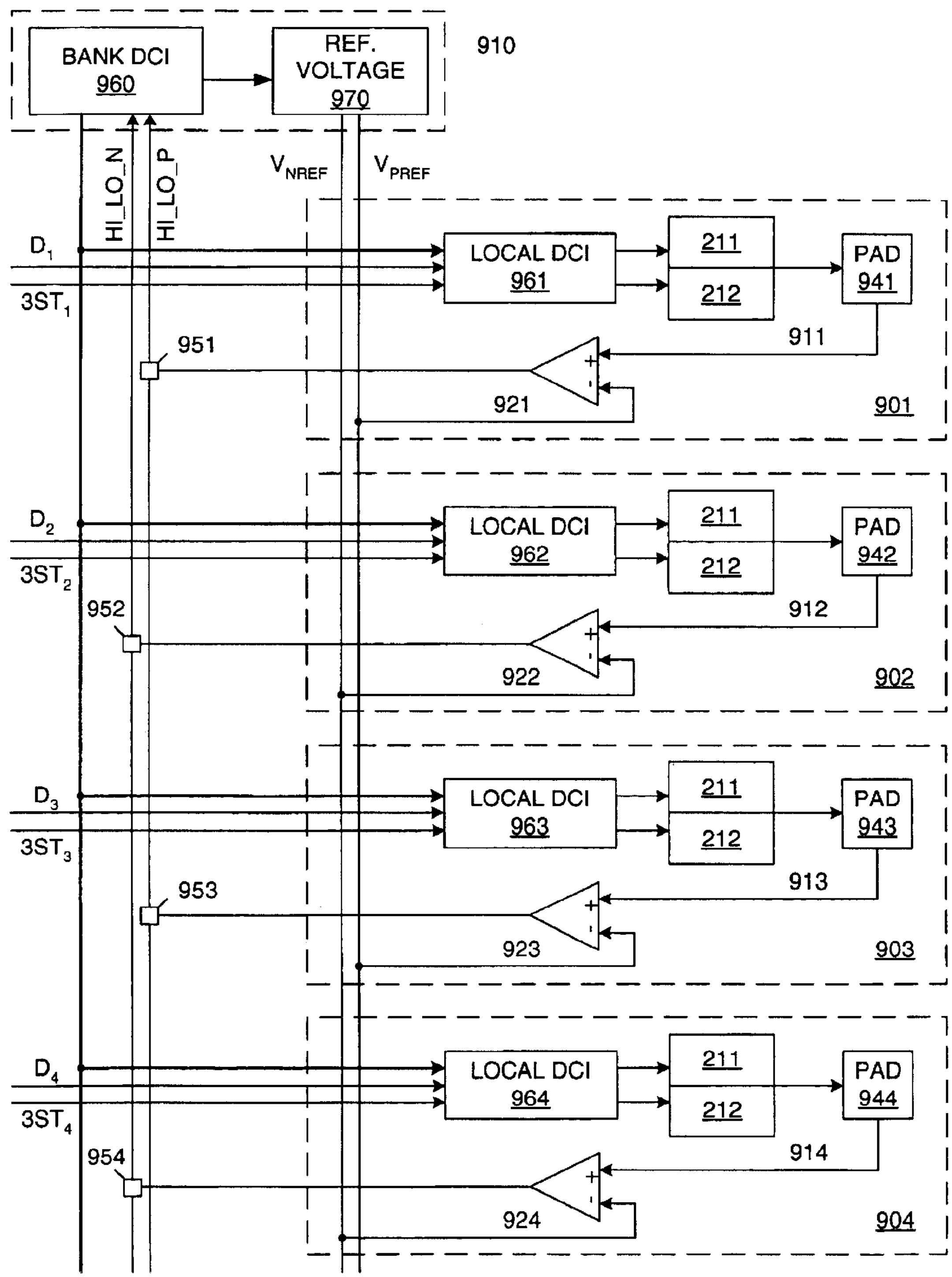
FIG. 9 is a circuit diagram illustrating selected portions of an IOB bank, including a bank impedance control circuit and selected IOBS.

FIG. 9 is a circuit diagram illustrating selected portions of IOB bank 801, including bank impedance control circuit 910 and IOBs 901–904. Note that the input buffer circuits (e.g., input buffer circuit 931) are not shown in FIG. 9 for purposes of clarity. IOBs 901–904 include respective local DCI circuits 961–964, respective output driver circuits 911–914, respective comparators 921–924 and respective I/O pads 941–944. Each of output driver circuits 911–914 includes a set of p-channel transistors 211 and a set of n-channel transistors 212, as described above in connection with FIGS. 2–4.

Reference voltage generator 970 provides the n-channel reference voltage, $V_{NREF}$, and the p-channel reference voltage $V_{PREF}$, on lines that extend through IOB bank 801. The comparator in every odd numbered IOB (e.g., 901, 903, 905) in IOB bank 801 is coupled to receive the $V_{PREF}$ voltage. The comparator in every even numbered IOB (e.g., 902, 904) in IOB bank 801 is coupled to receive the $V_{NREF}$ voltage.

The output terminals of the comparators in odd numbered IOBs are coupled to programmable connections (e.g., 951, 953), which if programmed, will connect a corresponding comparator to a common HI_LO_P line. Similarly, the output terminals of the comparators in even numbered IOBs are coupled to programmable connections (e.g., 952, 954), which if programmed, will connect a corresponding comparator to a common HI_LO_N line. The HI_LO_P line and the HI_LO_N line are routed to bank DCI circuit 960.

Bank DCI circuit 960 also provides control signals to local DCI circuits 961–964. These control signals will be described in more detail below. In general, IOB bank 801 operates as follows. One of the odd-numbered IOBs is selected to be a p-channel reference circuit, and one of the even-numbered IOBs is selected to be an n-channel reference circuit. This selection is made by setting a configuration memory bit in the local DCI circuit of each of these IOBS, and programming the connection to couple the output terminals of the comparators of these IOBs to the HI_LO_N and HI_LO_P lines. Although any one of the odd-numbered IOBs can be selected to be the p-channel reference circuit, IOB 901 is selected in the described example. Thus, a configuration memory bit in local DCI circuit 961 is set, and programmable connection 951 is enabled. Similarly, although any one of the even-numbered IOBs can be selected to be the n-channel reference circuit, IOB 902 is selected in the described example. Thus, a configuration memory bit in local DCI circuit 962 is set, and programmable connection 952 is enabled.

Because IOB 901 is to serve as the p-channel reference circuit, a predetermined reference resistance $R_{PREF}$ is connected between pad 941 and the ground terminal in the manner illustrated in FIG. 3. As a result, IOB 901 is configured in substantially the same manner illustrated in FIG. 3, except that the DCI circuit 201 of FIG. 3 has been divided into bank DCI circuit 960 and local DCI circuit 961.

Because IOB 902 is to serve as the n-channel reference circuit, a predetermined reference resistance $R_{NREF}$ is connected between pad 942 and an external $V_{CC}$ supply terminal in the manner illustrated in FIG. 4. As a result, IOB 902 is configured in substantially the same manner illustrated in FIG. 4, except that the DCI circuit 201 of FIG. 4 has been divided into bank DCI circuit 960 and local DCI circuit 962.

In general, IOB bank 801 operates as follows. P-channel reference circuit 901 and n-channel reference circuit 902 are initially set to have predetermined turned-on p-channel and n-channel transistors. During a first time period, bank DCI circuit 960 processes the HI_LO_P signal provided by p-channel reference circuit 901. In response, bank DCI circuit 960 instructs local DCI circuit 961 to enable/disable the p-channel transistors in driver circuit 911 in the manner described above in connection with FIG. 3. At the same time, bank DCI circuit 960 also instructs other local DCI circuits to enable/disable the same p-channel transistors as local DCI circuit 961. Thus, when logic low data signals D3–D4 are applied to local DCI circuits 963–964, these local DCI circuits will enable the same p-channel transistors determined by the p-channel reference circuit 901. For example, if bank DCI circuit 960 instructs local DCI circuit 961 in the p-channel reference circuit 901 to enable fine p-channel transistors P1–P4 and coarse p-channel transistor P14, then bank DCI circuit 960 will similarly instruct local DCI circuit 963 to enable fine p-channel transistors P1–P4 and coarse p-channel transistor P14 when data signal D3 has a logic low value.

During a second time period, bank DCI circuit 960 processes the HI_LO_N signal provided by n-channel reference circuit 902. In response, bank DCI circuit 960 instructs local DCI circuit 962 to enable/disable the n-channel transistors in driver circuit 912 in the manner described above in connection with FIG. 4. Bank DCI circuit 960 also instructs other local DCI circuits to enable/disable the same n-channel transistors as local DCI circuit 962. Thus, if bank DCI circuit 960 instructs local DCI circuit 962 in the n-channel reference circuit 902 to enable fine n-channel transistors N1–N2 and coarse n-channel transistor N13, then bank DCI circuit 960 will similarly instruct local DCI circuit 963 to enable fine n-channel transistors N1–N2 and coarse n-channel transistor N13 when data signal D3 has a logic high value.

Alternately, the IOB 904 can be configured in a manner different than IOB 903. For example, output driver circuit 913 of IOB 903 can be configured in response to different reference voltages ($V_{NREF}$ and $V_{PREF}$) than output driver circuit 914 of IOB 904. As a result, output driver circuit 913 will exhibit different resistances than output driver circuit 914. This is accomplished by providing different sets of reference voltages with reference voltage supply 970.

Reference voltage supply 970 can be controlled to provide different reference voltages $V_{PREF}$ and $V_{NREF}$ at different times. For example, reference voltage supply 970 can be controlled to provide a first set of reference voltages that are used by p-channel and n-channel reference circuits 901 and 902 to determine the appropriate p-channel and n-channel transistors to be enabled within IOB 903. Reference voltage supply 970 can also be controlled to provide a second set of reference voltages that are used by p-channel and n-channel reference circuits 901 and 902 to determine the appropriate p-channel and n-channel transistors to be enabled within IOB 904. In the described example, reference voltage supply 970 can be controlled to provide up to four sets of reference voltages. By providing different reference voltages, the on-resistances of different output driver circuits can be controlled to have different values, even though the resistances of the external reference resistors 305 and 405 remain constant. Bank DCI circuit 960 is able to address the local DCI circuits 961–964, such that the appropriate information is provided to the appropriate IOBs.

Figure 10:
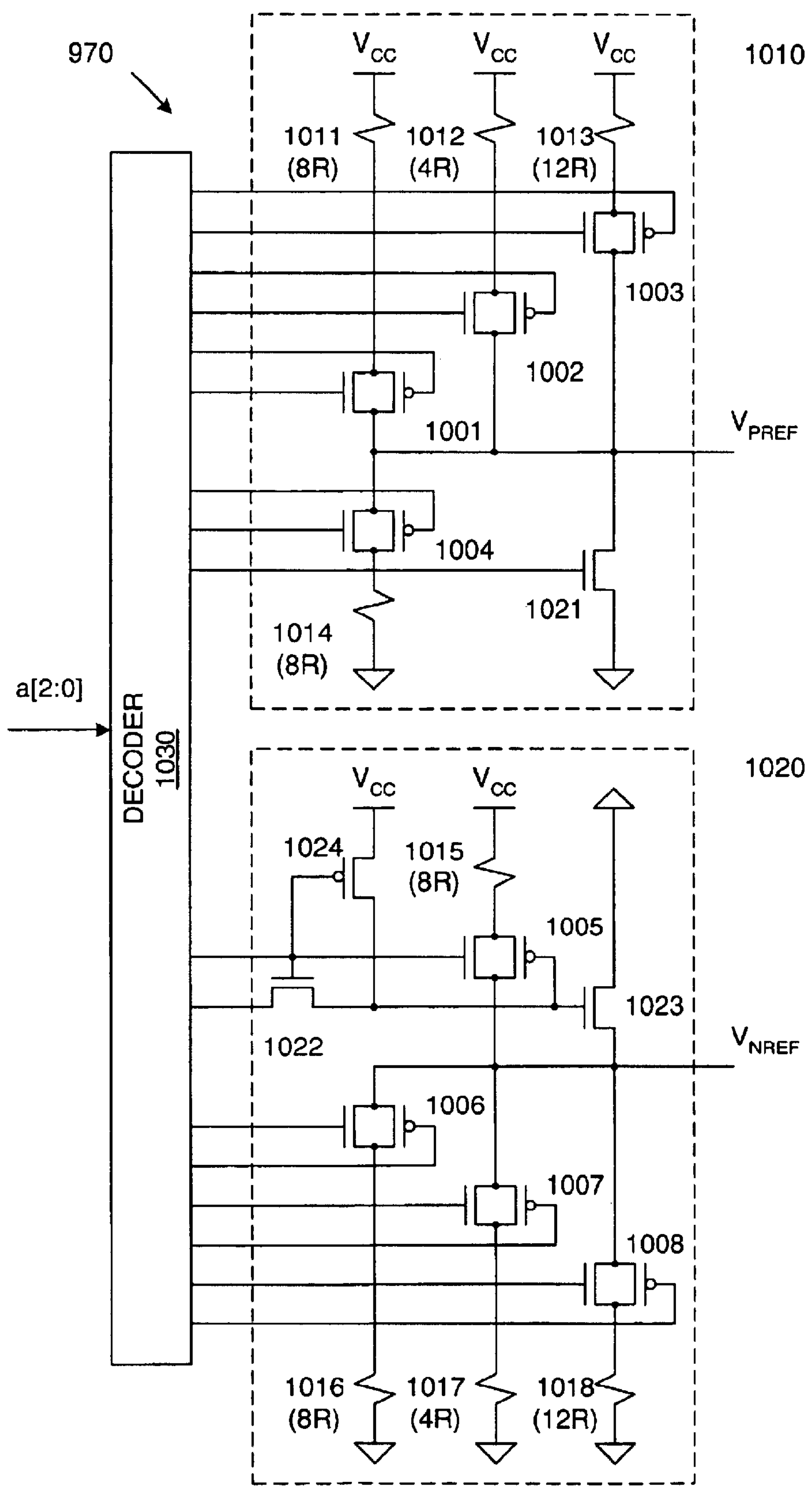
FIG. 10 is a circuit diagram of a reference voltage supply.

FIG. 10 is a circuit diagram of reference voltage supply 970. Reference voltage supply 970 includes p-channel reference voltage generator 1010, n-channel reference voltage generator 1020 and decoder circuit 1030. P-channel reference voltage generator 1010 includes transmission gates 1001–1004, resistors 1011–1014 and n-channel transistor 1021. Resistors 1011, 1012, 1013 and 1014 have relative resistances of 8R, 4R, 12R and 8R, respectively. N-channel reference voltage generator 1020 includes transmission gates 1005–1008, resistors 1015–1018, n-channel transistors 1022–1023 and p-channel transistor 1024. Resistors 1015, 1016, 1017 and 1018 have relative resistances of 8R, 8R, 4R and 12R, respectively. Decoder circuit receives address signals a[2:0] from bank DCI circuit 960, and in response, provides control signals to transmission gates 1001–1008 and transistors 1021–1023. Table 1 summarizes the status of transmission gates 1001–1004, transistor 1021 and the p-channel reference voltage $V_{PREF}$ for the various address signals a[2:0].

TABLE 1

| a[2:0] | 1001 | 1002 | 1003 | 1004 | 1021 | $V_{PREF}$ |
|---|---|---|---|---|---|---|
| 000<br>101<br>110<br>111 | OFF | OFF | OFF | OFF | ON | 0 |
| 001 | ON | OFF | OFF | ON | OFF | $V_{cc}/2$ |
| 010 | OFF | ON | OFF | ON | OFF | $2V_{cc}/3$ |
| 011 | ON | OFF | OFF | ON | OFF | $V_{cc}/2$ |
| 100 | OFF | OFF | ON | ON | OFF | $3V_{cc}/5$ |

Table 2 summarizes the status of transmission gates 1005–1008, transistor 1022–1024 and the n-channel reference voltage $V_{NREF}$ for the various address signals a[2:0].

TABLE 2

| a[2:0] | 1005<br>1022 | 1006 | 1007 | 1008 | 1023<br>1024 | $V_{NREF}$ |
|---|---|---|---|---|---|---|
| 000<br>101<br>110<br>111 | OFF | OFF | OFF | OFF | ON | 0 |
| 001 | ON | ON | OFF | OFF | OFF | $V_{cc}/2$ |
| 010 | ON | OFF | ON | OFF | OFF | $2V_{cc}/3$ |
| 011 | ON | ON | OFF | OFF | OFF | $V_{cc}/2$ |
| 100 | ON | OFF | OFF | ON | OFF | $3V_{cc}/5$ |

Addresses of "001" or "010" are used to provide DCI output driver circuits with different impedances (FIG. 5A). An address of "011" is used to provide a single termination pull-up to $V_{CC}$. An address of "100" is used to provide a termination pull-up to $V_{CC}/2$ (FIGS. 6B–6C, 7C–7D).

Figure 11:
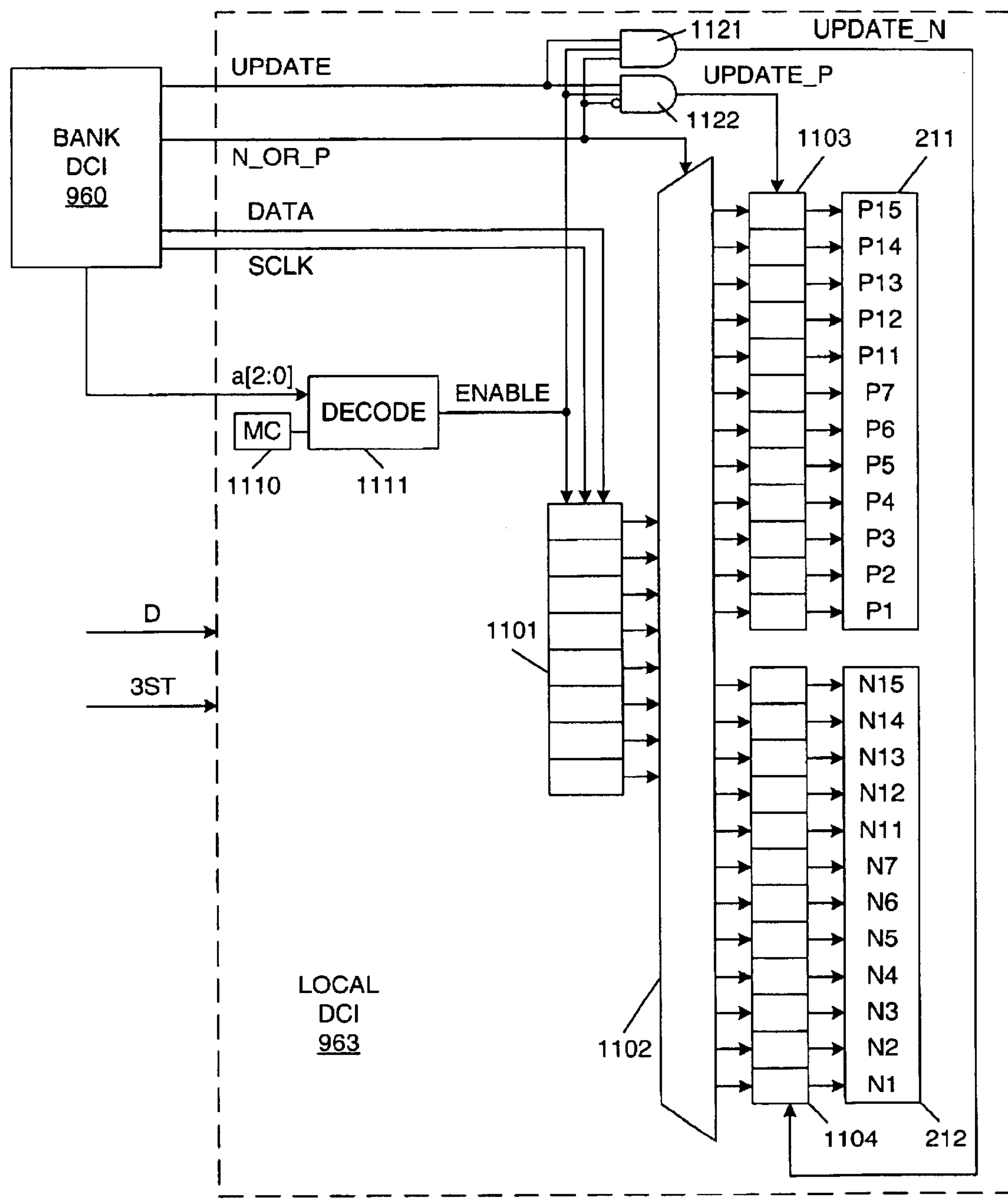
FIG. 11 is a block diagram illustrating a bank digitally controlled impedance (DCI) circuit and a local DCI circuit.

FIG. 11 is a block diagram illustrating bank DCI it 960 and local DCI circuit 963 in more detail. Local circuits 961–962 and 964 are identical to local DCI it 963.

Local DCI circuit 963 includes shift register 1101, data decoder 1102, p-channel register 1103, n-channel register 1104, configuration memory cells 1110, address decoder 1111 and logical AND gates 1121–1122. Bank DCI circuit 960 and local DCI circuit 963 operate as follows.

Configuration memory cells 1110 store four configuration bits. One of these configuration bits indicates whether IOB 903 will serve as a reference IOB. If this configuration bit is set, then address decoder 1111 will assert an ENABLE signal regardless of the state of the applied address signal a[2:0]. The remaining three configuration bits identify a "type" of the output driver circuit 913 (assuming that IOB 903 is not a reference IOB). There are five "types" of output driver circuits in the described example. Table 3 defines the reference voltages used for each of the five types. Note that the contents of configuration memory cells 1110 will correspond with one of the address signals a[2:0].

TABLE 3

| Type Configuration Memory Cells 1110 | $V_{PREF}$ | $V_{NREF}$ |
|---|---|---|
| 000, 101, 110, 111 | 0 | 0 |
| 001 | $V_{cc}/2$ | $V_{cc}/2$ |
| 010 | $2V_{cc}/3$ | $2V_{cc}/3$ |
| 011 | $V_{cc}/2$ | $V_{cc}/2$ |
| 100 | $3V_{cc}/5$ | $3V_{cc}/5$ |

If the address signal a[2:0] from bank DCI circuit 960 matches the contents of configuration memory cells 1110, then address decoder 1111 will assert an ENABLE signal, thereby enabling shift register 1101. In response to this ENABLE signal (and a SCLK clock signal provided by bank DCI circuit 960), shift register 1101 will sequentially shift in the DATA signal provided by bank DCI circuit 960. The DATA signal identifies the p-channel transistors 211 or the n-channel transistors 212 to be turned on during the present iteration. Shift register 1101 provides the loaded DATA values to data decoder 1102.

Bank DCI circuit 960 provides a N_OR_P control signal to data decoder 1102, thereby indicating whether the contents of shift register 1101 are intended to control the p-channel transistors 211 (N_OR_P=0), or the n-channel transistors 212 (N_OR_P=1) of output driver circuit 913. Bank DCI circuit 960 initially provides a N_OR_P signal having a logic "0" value. In response, data decoder 1102 will decode the contents of shift register 1101, and transmit the results to p-channel register 1103.

Bank DCI circuit 960 then asserts a logic high UPDATE signal, which causes AND gate 1121 to assert a logic high UPDATE_P signal. In response, p-channel register 1103 loads the results provided by data decoder 1102. The contents of p-channel register 1103 are then used to control p-channel transistors P1–P7 and P11–P15 in the manner described above.

Data decoder 1102 operates as follows. Data decoder receives the 8-bit signal D[7:0] received from shift register 1101. The D[7:0] signal includes five bits D[7:3] to control coarse transistors (i.e., coarse p-channel transistors P11–P15 or coarse n-channel transistors N11–N15). These five bits D[7:3] are routed directly through decoder 1102 to either register 1103 or 1104 in response to the N_OR_P signal. The D[7:0] signal also includes three bits D[2:0] to control fine transistors (i.e., fine p-channel transistors P1–P7 or fine n-channel transistors N1–N7). Decoder 1102 provides signals that will turn on 0 to 7 of the fine transistors in response to the D[2:0] bits.

The operation of IOB bank 801 will now be summarized. First, one of IOBs 901–905 is configured as a p-channel reference circuit, and another one of IOBs 901–905 is configured as an n-channel reference circuit. The remaining IOBs are configured to have a particular 'type' (e.g., a first type, a second type, etc.) by appropriately programming the configuration memory cells 1110 within the IOBs.

Bank DCI circuit 960 then asserts a first address signal $a_1[2:0]$ (e.g., "001") and a first data signal $D_1[7:0]$. The first address signal $a_1[2:0]$ causes reference voltage circuit 970 to generate a first pair of reference voltages $V_{PREF1}$ and $V_{NREF1}$ (e.g., $V_{CC}/2$ and $V_{CC}/2$) The first data signal $D_1[7:0]$, which identifies p-channel transistors to be enabled, is latched into the p-channel reference IOB. The first address signal $a_1[2:0]$ also causes the first data signal $D_1[7:0]$ to be latched into all of the IOBs of the first type.

The bank DCI circuit 960 then provides a logic low N_OR_P signal and a logic high UPDATE signal, thereby causing the first data signal $D_1[7:0]$ to be decoded and used to control the p-channel transistors in both the p-channel reference circuit and the IOBs of the first type. In response, the p-channel reference circuit provides a HI_LO_P signal having a logic high or low value to bank DCI circuit 960. This process is repeated until the p-channel reference circuit has provided the desired p-channel settings to all of the IOBs of the first type.

The address signal a[2:0] is then incremented to the second type ("010"), such that the reference voltage circuit 970 generates a second pair of reference voltages. In response, the p-channel reference circuit is used to provide the desired p-channel settings to all of the IOBs of the second type.

This process is repeated such that the desired p-channel settings are provided for all of the different types of IOBS. The n-channel reference circuit is then used to provide the desired n-channel settings for the different types of IOBs.

To provide the desired settings for the n-channel transistors, bank DCI circuit 960 asserts the first address signal $a_1[2:0]$ and then provides a data signal $D_2[7:0]$. This data signal $D_2[7:0]$, which identifies n-channel transistors to be enabled, is latched into the n-channel reference circuit. The first address signal $a_1[2:0]$ also enables the second data signal $D_2[7:0]$ to be latched into all of the IOBs of the first type.

The bank DCI circuit 960 then provides a logic high N_OR_P signal and a logic high UPDATE signal, thereby causing the data signal $D_2[7:0]$ to be decoded and used to control the n-channel transistors in both the n-channel reference circuit and the IOBs of the first type. In response, the n-channel reference IOB provides a HI_LO_N signal having a logic high or low value to bank DCI circuit 960. This process is repeated until the n-channel reference circuit has provided the desired n-channel settings to all of the IOBs of the first type.

The address signal a[2:0] is then incremented to the second type ("1010"), such that the reference voltage circuit 970 generates a second pair of reference voltages. In response, the n-channel reference circuit is used to provide the desired n-channel settings to all of the IOBs of the second type.

This process is repeated such that the desired n-channel settings are provided for all of the different types of IOBs. The process then repeats, with the p-channel transistor settings being updated for the various types, and then the n-channel transistor settings being updated for the various types. In this manner, the p-channel and n-channel determinations are continuously being updated for each type during operation of the chip.

Note that IOBs can be excluded from this process by programming the configuration memory cells 1110 to store a 3-bit value of "000", "101", "110" or "111". In this case, the p-channel and n-channel transistors to be enabled are determined by the user programming configuration memory cells.

Although the invention has been described in connection with several embodiments, it is understood that this invention is not limited to the embodiments disclosed, but is capable of various modifications which would be apparent to a person skilled in the art. For example, the DCI block 201 can be implemented as a state machine. In addition, although p-channel transistors have been used as pull-up elements, and n-channel transistors have been used as pull-down elements, n-channel transistors can be used as pull-up elements and p-channel transistors can be used as pull-down elements in other embodiments. Thus, the invention is limited only by the following claims.

What is claimed is:

1. A system comprising:

a first integrated circuit device including a first input/output (I/O) block having a first digitally controlled impedance (DCI) output driver circuit and an first input buffer, wherein the first DCI output driver circuit is configured to provide a first termination resistance;

a second integrated circuit device including a second I/O block having a second DCI output driver circuit and a second input buffer, wherein the second DCI output driver circuit is not configured to provide a termination resistance; and a line having an impedance, the line extending between the first I/O block and the second I/O block, wherein the line has bi-directional series termination; and wherein the first DCI output driver circuit comprises a plurality of transistors under control of a feedback loop and configured to provide a predetermined relationship with a reference resistance.

2. The system of claim 1, wherein the first and second I/O blocks operate in response to a $V_{CC}$ supply voltage, and the first termination resistance is coupled to an effective termination voltage $V_{TT}$.

3. The system of claim 2, wherein the effective termination voltage is equal to $V_{CC}/2$.

4. The system of claim 1 wherein the plurality of transistors have an output voltage coupled to a pad and are selectable by a digitally controlled impedance (DCI) circuit, and wherein the feedback loop comprises a comparator coupled to the pad and the DCI circuit, the comparator comparing the output voltage to a reference voltage.

5. A system comprising:

a first device including a first input/output (I/O) block having a first digitally controlled impedance (DCI) output driver circuit and a first input buffer, wherein the first DCI output driver circuit is configured to provide a first termination resistance;

a second device including a second I/O block having a second DCI output driver circuit and a second input buffer, wherein the second DCI output driver circuit is configured to provide a second termination resistance, different than the first termination resistance; and a line having an impedance, the line extending between the first I/O block and the second I/O block, wherein the line has bi-directional series termination; and wherein the first DCI output driver circuit comprises a plurality of transistors under control of a feed back loop and configured to provide a predetermined relationship with a reference resistance.

6. The system of claim 5, wherein the first resistance is effectively located in parallel with the line, and the second resistance is effectively located in series with the line.

7. A system comprising:

a first integrated circuit device having configurable logic blocks and programmable interconnect circuitry, the first integrated circuit device including a first input/output (I/O) block having a first digitally controlled impedance (DCI) output driver circuit and an first input buffer, wherein the first DCI output driver circuit is configured to provide a first termination resistance;

a second integrated circuit device including a second I/O block having a second DCI output driver circuit and a second input buffer, wherein the second DCI output driver circuit is not configured to provide a termination resistance; and a line having an impedance, the line extending between the first I/O block and the second I/O block, wherein the line has bi-directional series termination.

8. The system of claim 7, wherein the first termination resistance matches the impedance of the line.

9. The system of claim 4 wherein the DCI circuit comprises a decoder for selecting transistors of the plurality of transistors.

10. The system of claim 9 wherein the plurality of transistors comprise p-channel and n-channel transistors.

* * * * *